US009542352B2

(12) United States Patent
Rajan et al.

(10) Patent No.: US 9,542,352 B2
(45) Date of Patent: Jan. 10, 2017

(54) SYSTEM AND METHOD FOR REDUCING COMMAND SCHEDULING CONSTRAINTS OF MEMORY CIRCUITS

(75) Inventors: Suresh Natarajan Rajan, San Jose, CA (US); Keith R. Schakel, San Jose, CA (US); Michael John Sebastian Smith, Palo Alto, CA (US); David T. Wang, San Jose, CA (US); Frederick Daniel Weber, San Jose, CA (US)

(73) Assignee: Google Inc., Mountain View, CA (US)

( * ) Notice: Subject to any disclaimer, the term of this patent is extended or adjusted under 35 U.S.C. 154(b) by 1255 days.

(21) Appl. No.: 11/672,921

(22) Filed: Feb. 8, 2007

(65) Prior Publication Data

US 2007/0204075 A1    Aug. 30, 2007

Related U.S. Application Data

(63) Continuation-in-part of application No. 11/461,437, filed on Jul. 31, 2006, now Pat. No. 8,077,535, and a continuation-in-part of application No. 11/702,981, filed on Feb. 5, 2007, now Pat. No. 8,089,795, and a continuation-in-part of application No. 11/702,960, filed on Feb. 5, 2007.

(60) Provisional application No. 60/772,414, filed on Feb. 9, 2006, provisional application No. 60/865,624, filed on Nov. 13, 2006.

(51) Int. Cl.
*G06F 13/00* (2006.01)
*G06F 13/42* (2006.01)
*G06F 13/28* (2006.01)
*G11C 11/406* (2006.01)
*G11C 11/4093* (2006.01)

(52) U.S. Cl.
CPC .......... *G06F 13/4243* (2013.01); *G06F 13/28* (2013.01); *G11C 11/406* (2013.01); *G11C 11/4093* (2013.01); *G11C 11/40618* (2013.01); *Y02B 60/1228* (2013.01); *Y02B 60/1235* (2013.01)

(58) Field of Classification Search
None
See application file for complete search history.

(56) References Cited

U.S. PATENT DOCUMENTS

| | | |
|---|---|---|
| 3,800,292 A | 3/1974 | Curley et al. |
| 4,069,452 A | 1/1978 | Conway et al. |
| 4,323,965 A | 4/1982 | Johnson et al. |
| 4,392,212 A | 7/1983 | Miyasaka et al. ............ 365/230 |
| 4,525,921 A | 7/1985 | Carson et al. |
| 4,566,082 A | 1/1986 | Anderson |
| 4,592,019 A | 5/1986 | Huang et al. ................... 365/78 |
| 4,646,128 A | 2/1987 | Carson et al. |
| 4,698,748 A | 10/1987 | Juzswik et al. ............... 364/200 |
| 4,706,166 A | 11/1987 | Go |
| 4,710,903 A | 12/1987 | Hereth et al. ................. 365/194 |
| 4,764,846 A | 8/1988 | Go |

(Continued)

FOREIGN PATENT DOCUMENTS

| | | | |
|---|---|---|---|
| DE | 102004051345 | 5/2006 | ............ G11C 29/12 |
| DE | 102004053316 | 5/2006 | |

(Continued)

OTHER PUBLICATIONS

Search Report and Written Opinion from PCT Application No. PCT/US07/03460 mailed Feb. 14, 2008.

(Continued)

*Primary Examiner* — Christian P Chace
*Assistant Examiner* — Eric Loonan
(74) *Attorney, Agent, or Firm* — Fish & Richardson P.C.

(57) ABSTRACT

A memory circuit system and method are provided. An interface circuit is capable of communication with a plurality of memory circuits and a system. In use, the interface circuit is operable to interface the memory circuits and the system for reducing command scheduling constraints of the memory circuits.

18 Claims, 15 Drawing Sheets

(56) References Cited

U.S. PATENT DOCUMENTS

| | | | | |
|---|---|---|---|---|
| 4,780,843 A | 10/1988 | Tietjen | | 364/900 |
| 4,796,232 A | 1/1989 | House | | 365/189 |
| 4,807,191 A | 2/1989 | Flannagan | | |
| 4,841,440 A | 6/1989 | Yonezu et al. | | 364/200 |
| 4,884,237 A | 11/1989 | Mueller et al. | | 365/63 |
| 4,887,240 A | 12/1989 | Garverick et al. | | 361/222 |
| 4,888,687 A | 12/1989 | Allison et al. | | |
| 4,899,107 A | 2/1990 | Corbett et al. | | 324/158 |
| 4,912,678 A | 3/1990 | Mashiko | | |
| 4,935,734 A | 6/1990 | Austin | | 340/825.83 |
| 4,937,791 A | 6/1990 | Steele et al. | | |
| 4,956,694 A | 9/1990 | Eide | | |
| 4,982,265 A | 1/1991 | Watanabe et al. | | |
| 4,983,533 A | 1/1991 | Go | | |
| 5,025,364 A | 6/1991 | Zellmer | | |
| 5,072,424 A | 12/1991 | Brent et al. | | 365/189 |
| 5,083,266 A | 1/1992 | Watanabe | | 395/275 |
| 5,104,820 A | 4/1992 | Go et al. | | |
| 5,193,072 A | 3/1993 | Frenkil et al. | | |
| 5,212,666 A | 5/1993 | Takeda | | |
| 5,220,672 A | 6/1993 | Nakao et al. | | 395/750 |
| 5,241,266 A | 8/1993 | Ahmad et al. | | 324/158 |
| 5,252,807 A | 10/1993 | Chizinsky | | 219/390 |
| 5,257,233 A | 10/1993 | Schaefer | | 365/227 |
| 5,278,796 A | 1/1994 | Tillinghast et al. | | 365/211 |
| 5,282,177 A | 1/1994 | McLaury | | 365/230 |
| 5,332,922 A | 7/1994 | Oguchi et al. | | 257/723 |
| 5,347,428 A | 9/1994 | Carson et al. | | |
| 5,369,749 A | 11/1994 | Baker et al. | | |
| 5,384,745 A | 1/1995 | Konishi et al. | | 365/230.03 |
| 5,388,265 A | 2/1995 | Volk | | 395/750 |
| 5,390,334 A | 2/1995 | Harrison | | |
| 5,392,251 A | 2/1995 | Manning | | |
| 5,408,190 A | 4/1995 | Wood et al. | | 324/765 |
| 5,432,729 A | 7/1995 | Carson et al. | | 365/63 |
| 5,448,511 A | 9/1995 | Paurus et al. | | 365/52 |
| 5,453,434 A | 9/1995 | Albaugh et al. | | 514/397 |
| 5,467,455 A | 11/1995 | Gay et al. | | 395/281 |
| 5,483,497 A | 1/1996 | Mochizuki et al. | | |
| 5,498,886 A | 3/1996 | Hsu et al. | | 257/213 |
| 5,502,667 A | 3/1996 | Bertin et al. | | 365/51 |
| 5,513,135 A * | 4/1996 | Dell et al. | | 365/52 |
| 5,513,339 A | 4/1996 | Agrawal et al. | | |
| 5,526,320 A | 6/1996 | Zagar et al. | | 365/233 |
| 5,530,836 A | 6/1996 | Busch et al. | | 395/477 |
| 5,550,781 A | 8/1996 | Sugawara et al. | | |
| 5,559,990 A | 9/1996 | Cheng et al. | | 395/484 |
| 5,561,622 A | 10/1996 | Bertin et al. | | 365/51 |
| 5,563,086 A | 10/1996 | Bertin et al. | | |
| 5,566,344 A | 10/1996 | Hall et al. | | 395/800 |
| 5,581,498 A | 12/1996 | Ludwig et al. | | 365/63 |
| 5,581,779 A | 12/1996 | Hall et al. | | 395/800 |
| 5,590,071 A | 12/1996 | Kolor et al. | | 365/149 |
| 5,598,376 A | 1/1997 | Merritt et al. | | 365/230 |
| 5,604,714 A | 2/1997 | Manning et al. | | 365/230 |
| 5,606,710 A | 2/1997 | Hall et al. | | 395/800 |
| 5,608,262 A | 3/1997 | Degani et al. | | |
| 5,610,864 A | 3/1997 | Manning | | 365/193 |
| 5,623,686 A | 4/1997 | Hall et al. | | 395/800 |
| 5,627,791 A | 5/1997 | Wright et al. | | 365/222 |
| 5,640,337 A | 6/1997 | Huang et al. | | 364/578 |
| 5,640,364 A | 6/1997 | Merritt et al. | | 365/233 |
| 5,652,724 A | 7/1997 | Manning | | 365/189 |
| 5,654,204 A | 8/1997 | Anderson | | 438/15 |
| 5,661,677 A | 8/1997 | Rondeau et al. | | 365/63 |
| 5,661,695 A | 8/1997 | Zagar et al. | | 365/233 |
| 5,668,773 A | 9/1997 | Zagar et al. | | 365/233 |
| 5,675,549 A | 10/1997 | Ong et al. | | 365/233 |
| 5,680,342 A | 10/1997 | Frankeny | | 365/52 |
| 5,682,354 A | 10/1997 | Manning | | 365/233 |
| 5,692,202 A | 11/1997 | Kardach et al. | | 395/750 |
| 5,696,732 A | 12/1997 | Zagar et al. | | 365/233 |
| 5,702,984 A | 12/1997 | Bertin et al. | | |
| 5,703,813 A | 12/1997 | Manning et al. | | 365/189 |
| 5,706,247 A | 1/1998 | Merritt et al. | | 365/233 |
| RE35,733 E | 2/1998 | Hernandez et al. | | |
| 5,717,654 A | 2/1998 | Manning | | 365/233 |
| 5,721,859 A | 2/1998 | Manning | | 397/421 |
| 5,724,288 A | 3/1998 | Cloud et al. | | 365/193 |
| 5,729,503 A | 3/1998 | Manning | | 365/233 |
| 5,729,504 A | 3/1998 | Cowles | | 365/236 |
| 5,748,914 A | 5/1998 | Barth et al. | | 395/285 |
| 5,752,045 A | 5/1998 | Chen | | 395/750 |
| 5,757,703 A | 5/1998 | Merritt et al. | | 365/189 |
| 5,760,478 A | 6/1998 | Bozso et al. | | |
| 5,761,703 A | 6/1998 | Bolyn | | 711/106 |
| 5,781,766 A | 7/1998 | Davis | | 395/552 |
| 5,787,457 A | 7/1998 | Miller et al. | | |
| 5,798,961 A | 8/1998 | Heyden et al. | | 365/52 |
| 5,802,010 A | 9/1998 | Zagar et al. | | 365/233 |
| 5,802,395 A | 9/1998 | Connolly et al. | | |
| 5,802,555 A | 9/1998 | Shigeeda | | 711/106 |
| 5,812,488 A | 9/1998 | Zagar et al. | | 365/233 |
| 5,818,788 A | 10/1998 | Kimura et al. | | |
| 5,819,065 A | 10/1998 | Chilton et al. | | |
| 5,831,833 A | 11/1998 | Shirakawa et al. | | |
| 5,831,931 A | 11/1998 | Manning | | 365/233 |
| 5,831,932 A | 11/1998 | Merritt et al. | | 365/233 |
| 5,834,838 A | 11/1998 | Anderson | | 257/697 |
| 5,835,435 A | 11/1998 | Bogin et al. | | 365/227 |
| 5,838,165 A | 11/1998 | Chatter | | |
| 5,838,177 A | 11/1998 | Keeth | | 327/108 |
| 5,841,580 A | 11/1998 | Farmwald et al. | | 365/194 |
| 5,843,799 A | 12/1998 | Hsu et al. | | 438/6 |
| 5,843,807 A | 12/1998 | Burns | | |
| 5,845,108 A | 12/1998 | Yoo et al. | | 395/551 |
| 5,850,368 A | 12/1998 | Ong et al. | | 365/238 |
| 5,859,792 A | 1/1999 | Rondeau et al. | | 365/52 |
| 5,860,106 A | 1/1999 | Domen et al. | | 711/137 |
| 5,870,347 A | 2/1999 | Keeth et al. | | 365/230 |
| 5,875,142 A | 2/1999 | Chevallier | | 365/212 |
| 5,878,279 A | 3/1999 | Athenes | | |
| 5,884,088 A | 3/1999 | Kardach et al. | | 395/750 |
| 5,901,105 A | 5/1999 | Ong et al. | | 365/230 |
| 5,903,500 A | 5/1999 | Tsang et al. | | 365/189.05 |
| 5,905,688 A | 5/1999 | Park | | 365/227 |
| 5,907,512 A | 5/1999 | Parkinson et al. | | 365/195 |
| 5,913,072 A | 6/1999 | Wieringa | | |
| 5,915,105 A | 6/1999 | Farmwald et al. | | 395/309 |
| 5,917,758 A | 6/1999 | Keeth | | 365/189.05 |
| 5,923,611 A | 7/1999 | Ryan | | 365/233 |
| 5,924,111 A | 7/1999 | Huang et al. | | |
| 5,926,435 A | 7/1999 | Park et al. | | 365/233 |
| 5,929,650 A | 7/1999 | Pappert et al. | | 324/763 |
| 5,943,254 A | 8/1999 | Bakeman, Jr. et al. | | 365/72 |
| 5,946,265 A | 8/1999 | Cowles | | 365/233 |
| 5,949,254 A | 9/1999 | Keeth | | 326/87 |
| 5,953,215 A | 9/1999 | Karabatsos | | 361/767 |
| 5,953,263 A | 9/1999 | Farmwald et al. | | 365/194 |
| 5,954,804 A | 9/1999 | Farmwald et al. | | 710/36 |
| 5,956,233 A | 9/1999 | Yew et al. | | 361/760 |
| 5,962,435 A | 10/1999 | Mao et al. | | 514/63 |
| 5,963,429 A | 10/1999 | Chen | | |
| 5,963,463 A | 10/1999 | Rondeau et al. | | 365/52 |
| 5,963,464 A | 10/1999 | Dell et al. | | 365/52 |
| 5,963,504 A | 10/1999 | Manning | | 365/233 |
| 5,966,724 A | 10/1999 | Ryan | | 711/105 |
| 5,966,727 A | 10/1999 | Nishino | | 711/127 |
| 5,969,996 A | 10/1999 | Muranaka et al. | | 365/189.01 |
| 5,973,392 A | 10/1999 | Senba et al. | | |
| 5,978,304 A | 11/1999 | Crafts | | |
| 5,995,443 A | 11/1999 | Farmwald et al. | | 365/233 |
| 6,001,671 A | 12/1999 | Fjelstad | | |
| 6,002,613 A | 12/1999 | Cloud et al. | | 365/189 |
| 6,002,627 A | 12/1999 | Chevallier | | 365/212 |
| 6,014,339 A | 1/2000 | Kobayashi et al. | | 365/233 |
| 6,016,282 A | 1/2000 | Keeth | | 365/233 |
| 6,026,050 A | 2/2000 | Baker et al. | | 365/233 |
| 6,029,250 A | 2/2000 | Keeth | | 713/400 |
| 6,032,214 A | 2/2000 | Farmwald et al. | | 710/129 |
| 6,032,215 A | 2/2000 | Farmwald et al. | | 710/129 |
| 6,034,916 A | 3/2000 | Lee | | 365/233 |
| 6,034,918 A | 3/2000 | Farmwald et al. | | 365/233 |
| 6,035,365 A | 3/2000 | Farmwald et al. | | 710/129 |

(56) References Cited

U.S. PATENT DOCUMENTS

| | | | |
|---|---|---|---|
| 6,038,195 A | 3/2000 | Farmwald et al. | 365/233 |
| 6,038,673 A | 3/2000 | Benn et al. | 713/323 |
| 6,044,032 A | 3/2000 | Li | 365/230 |
| 6,047,344 A | 4/2000 | Kawasumi et al. | 710/107 |
| 6,053,948 A | 4/2000 | Vaidyanathan et al. | 703/14 |
| 6,058,451 A | 5/2000 | Bermingham et al. | |
| 6,065,092 A | 5/2000 | Roy | |
| 6,069,504 A | 5/2000 | Keeth | 327/108 |
| 6,070,217 A | 5/2000 | Connolly et al. | 710/131 |
| 6,073,223 A | 6/2000 | McAllister et al. | 711/167 |
| 6,075,730 A | 6/2000 | Barth et al. | 365/191 |
| 6,075,744 A | 6/2000 | Tsern et al. | 365/230 |
| 6,078,546 A | 6/2000 | Lee | 365/233 |
| 6,079,025 A | 6/2000 | Fung | 713/323 |
| 6,084,434 A | 7/2000 | Keeth | 326/87 |
| 6,088,290 A | 7/2000 | Ohtake et al. | 365/233 |
| 6,091,251 A | 7/2000 | Wood et al. | 324/755 |
| RE36,839 E | 8/2000 | Simmons et al. | 326/93 |
| 6,101,152 A | 8/2000 | Farmwald et al. | 365/233 |
| 6,101,564 A | 8/2000 | Athenes et al. | |
| 6,101,612 A | 8/2000 | Jeddeloh | 713/401 |
| 6,108,795 A | 8/2000 | Jeddeloh | 713/401 |
| 6,111,812 A | 8/2000 | Gans et al. | 365/233 |
| 6,134,638 A | 10/2000 | Olarig et al. | 711/167 |
| 6,154,370 A | 11/2000 | Degani et al. | 361/761 |
| 6,166,991 A | 12/2000 | Phelan | 365/233 |
| 6,181,640 B1 | 1/2001 | Kang | |
| 6,182,184 B1 | 1/2001 | Farmwald et al. | 710/129 |
| 6,199,151 B1 | 3/2001 | Williams et al. | |
| 6,208,168 B1 | 3/2001 | Rhee | 326/83 |
| 6,216,246 B1 | 4/2001 | Shau | 714/763 |
| 6,222,739 B1 | 4/2001 | Bhakta et al. | 361/790 |
| 6,226,709 B1 | 5/2001 | Goodwin et al. | |
| 6,226,730 B1 | 5/2001 | Murdoch et al. | |
| 6,233,192 B1 | 5/2001 | Tanaka | 365/222 |
| 6,233,650 B1 | 5/2001 | Johnson et al. | |
| 6,240,048 B1 | 5/2001 | Matsubara | 365/233 |
| 6,243,282 B1 | 6/2001 | Rondeau et al. | 365/52 |
| 6,252,807 B1 | 6/2001 | Suzuki et al. | 365/193 |
| 6,253,278 B1 | 6/2001 | Ryan | |
| 6,260,097 B1 | 7/2001 | Farmwald et al. | 710/129 |
| 6,260,154 B1 | 7/2001 | Jeddeloh | 713/401 |
| 6,262,938 B1 | 7/2001 | Lee et al. | 365/233 |
| 6,266,285 B1 | 7/2001 | Farmwald et al. | 365/194 |
| 6,266,292 B1 | 7/2001 | Tsern et al. | 365/230 |
| 6,274,395 B1 | 8/2001 | Weber | 438/14 |
| 6,279,069 B1 | 8/2001 | Robinson et al. | 711/103 |
| 6,295,572 B1 | 9/2001 | Wu | 710/131 |
| 6,298,426 B1 | 10/2001 | Ajanovic | 711/172 |
| 6,304,511 B1 | 10/2001 | Gans et al. | 365/233 |
| 6,307,769 B1 | 10/2001 | Nuxoll et al. | 365/63 |
| 6,314,051 B1 | 11/2001 | Farmwald et al. | 365/233 |
| 6,317,352 B1 | 11/2001 | Halbert et al. | 365/52 |
| 6,317,381 B1 | 11/2001 | Gans et al. | 365/233 |
| 6,324,120 B2 | 11/2001 | Farmwald et al. | 365/233 |
| 6,326,810 B1 | 12/2001 | Keeth | 326/83 |
| 6,327,664 B1 | 12/2001 | Dell et al. | 713/323 |
| 6,330,683 B1 | 12/2001 | Jeddeloh | 713/401 |
| 6,336,174 B1 | 1/2002 | Li et al. | |
| 6,338,108 B1 | 1/2002 | Motomura | 710/110 |
| 6,338,113 B1 | 1/2002 | Kubo et al. | 711/105 |
| 6,341,347 B1 | 1/2002 | Joy et al. | 712/228 |
| 6,343,019 B1 | 1/2002 | Jiang et al. | |
| 6,343,042 B1 | 1/2002 | Tsern et al. | 365/222 |
| 6,353,561 B1 | 3/2002 | Funyu et al. | 365/195 |
| 6,356,105 B1 | 3/2002 | Volk | 326/30 |
| 6,356,500 B1 | 3/2002 | Cloud et al. | 365/226 |
| 6,362,656 B2 | 3/2002 | Rhee | 326/87 |
| 6,363,031 B2 | 3/2002 | Phelan | 365/233 |
| 6,378,020 B2 | 4/2002 | Farmwald et al. | 710/129 |
| 6,381,188 B1 | 4/2002 | Choi et al. | 365/222 |
| 6,381,668 B1 | 4/2002 | Lunteren | 711/5 |
| 6,389,514 B1* | 5/2002 | Rokicki | 711/136 |
| 6,392,304 B1 | 5/2002 | Butler | 257/777 |
| 6,414,868 B1 | 7/2002 | Wong et al. | 365/51 |
| 6,418,034 B1 | 7/2002 | Weber et al. | 361/790 |
| 6,424,532 B2 | 7/2002 | Kawamura | |
| 6,426,916 B2 | 7/2002 | Farmwald et al. | 365/233 |
| 6,429,029 B1 | 8/2002 | Eldridge et al. | 438/14 |
| 6,430,103 B2 | 8/2002 | Nakayama et al. | 365/230.03 |
| 6,434,660 B1 | 8/2002 | Lambert et al. | |
| 6,437,600 B1 | 8/2002 | Keeth | 326/86 |
| 6,438,057 B1 | 8/2002 | Ruckerbauer | 365/222 |
| 6,442,698 B2 | 8/2002 | Nizar | 713/320 |
| 6,445,591 B1 | 9/2002 | Kwong | |
| 6,452,826 B1 | 9/2002 | Kim et al. | 365/51 |
| 6,452,863 B2 | 9/2002 | Farmwald et al. | 365/233 |
| 6,453,400 B1 | 9/2002 | Maesako et al. | 711/167 |
| 6,453,402 B1 | 9/2002 | Jeddeloh | 711/167 |
| 6,453,434 B2 | 9/2002 | Delp et al. | |
| 6,457,095 B1 | 9/2002 | Volk | 711/105 |
| 6,459,651 B1 | 10/2002 | Lee et al. | 365/233 |
| 6,473,831 B1 | 10/2002 | Schade | 711/115 |
| 6,476,476 B1 | 11/2002 | Glenn | |
| 6,480,929 B1 | 11/2002 | Gauthier et al. | 711/105 |
| 6,487,102 B1 | 11/2002 | Halbert et al. | 365/51 |
| 6,489,669 B2 | 12/2002 | Shimada et al. | |
| 6,490,161 B1 | 12/2002 | Johnson | |
| 6,492,726 B1 | 12/2002 | Quek et al. | |
| 6,493,789 B2 | 12/2002 | Ware et al. | 711/105 |
| 6,496,440 B2 | 12/2002 | Manning | 365/230 |
| 6,496,897 B2 | 12/2002 | Ware et al. | 711/105 |
| 6,498,766 B2 | 12/2002 | Lee et al. | 365/233 |
| 6,510,097 B2 | 1/2003 | Fukuyama | 365/230.03 |
| 6,510,503 B2 | 1/2003 | Gillingham et al. | 711/167 |
| 6,512,392 B2 | 1/2003 | Fleury et al. | 324/765 |
| 6,521,984 B2 | 2/2003 | Matsuura | |
| 6,526,471 B1 | 2/2003 | Shimomura et al. | 711/5 |
| 6,526,473 B1 | 2/2003 | Kim | |
| 6,526,484 B1 | 2/2003 | Stacovsky et al. | 711/158 |
| 6,545,895 B1 | 4/2003 | Li et al. | 365/52 |
| 6,546,446 B2 | 4/2003 | Farmwald et al. | 710/305 |
| 6,553,450 B1 | 4/2003 | Dodd et al. | 711/105 |
| 6,560,158 B2 | 5/2003 | Choi et al. | 365/226 |
| 6,563,337 B2 | 5/2003 | Dour | 326/30 |
| 6,563,759 B2 | 5/2003 | Yahata et al. | 365/233 |
| 6,564,281 B2 | 5/2003 | Farmwald et al. | 710/305 |
| 6,564,285 B1 | 5/2003 | Mills et al. | 711/103 |
| 6,574,150 B2 | 6/2003 | Suyama et al. | 365/189 |
| 6,584,037 B2 | 6/2003 | Farmwald et al. | 365/233 |
| 6,587,912 B2 | 7/2003 | Leddige et al. | 711/5 |
| 6,590,822 B2 | 7/2003 | Hwang et al. | 365/222 |
| 6,594,770 B1 | 7/2003 | Sato et al. | 713/320 |
| 6,597,616 B2 | 7/2003 | Tsern et al. | 365/222 |
| 6,597,617 B2 | 7/2003 | Ooishi et al. | 365/222 |
| 6,614,700 B2 | 9/2003 | Dietrich et al. | 365/194 |
| 6,618,267 B1 | 9/2003 | Dalal et al. | |
| 6,618,791 B1 | 9/2003 | Dodd et al. | 711/105 |
| 6,621,760 B1 | 9/2003 | Ahmad et al. | 365/233 |
| 6,628,538 B2 | 9/2003 | Funaba et al. | |
| 6,630,729 B2 | 10/2003 | Huang | |
| 6,631,086 B1 | 10/2003 | Bill et al. | 365/185.09 |
| 6,639,820 B1 | 10/2003 | Khandekar et al. | 365/63 |
| 6,646,939 B2 | 11/2003 | Kwak | 365/219 |
| 6,650,588 B2 | 11/2003 | Yamagata | 365/222 |
| 6,650,594 B1 | 11/2003 | Lee et al. | 365/233 |
| 6,657,634 B1 | 12/2003 | Sinclair et al. | |
| 6,657,918 B2 | 12/2003 | Foss et al. | 365/233 |
| 6,657,919 B2 | 12/2003 | Foss et al. | 365/233 |
| 6,658,530 B1 | 12/2003 | Robertson et al. | 711/115 |
| 6,659,512 B1 | 12/2003 | Harper et al. | |
| 6,664,625 B2 | 12/2003 | Hiruma | |
| 6,665,224 B1 | 12/2003 | Lehmann et al. | 365/222 |
| 6,665,227 B2 | 12/2003 | Fetzer | 365/229 |
| 6,668,242 B1 | 12/2003 | Reynov et al. | |
| 6,683,372 B1 | 1/2004 | Wong et al. | |
| 6,690,191 B2 | 2/2004 | Wu et al. | |
| 6,697,295 B2 | 2/2004 | Farmwald et al. | 365/233 |
| 6,701,446 B2 | 3/2004 | Tsern et al. | 713/501 |
| 6,705,877 B1 | 3/2004 | Li et al. | |
| 6,708,144 B1 | 3/2004 | Merryman et al. | 703/14 |
| 6,711,043 B2 | 3/2004 | Friedman et al. | |
| 6,713,856 B2 | 3/2004 | Tsai et al. | |
| 6,714,891 B2 | 3/2004 | Dendinger | 702/132 |

(56) References Cited

U.S. PATENT DOCUMENTS

| | | | |
|---|---|---|---|
| 6,724,684 B2 | 4/2004 | Kim | 365/233 |
| 6,730,540 B2 | 5/2004 | Siniaguine | |
| 6,731,009 B1 | 5/2004 | Jones et al. | |
| 6,731,527 B2 | 5/2004 | Brown | 365/63 |
| 6,742,098 B1 | 5/2004 | Halbert et al. | |
| 6,744,687 B2 | 6/2004 | Koo et al. | 365/226 |
| 6,747,887 B2 | 6/2004 | Halbert et al. | 365/51 |
| 6,751,113 B2 | 6/2004 | Bhakta et al. | 365/63 |
| 6,751,696 B2 | 6/2004 | Farmwald et al. | 710/305 |
| 6,754,129 B2 | 6/2004 | Khateri et al. | 365/226 |
| 6,754,132 B2 | 6/2004 | Kyung | 365/233 |
| 6,757,751 B1 | 6/2004 | Gene | 710/36 |
| 6,762,948 B2 | 7/2004 | Kyun et al. | 365/51 |
| 6,765,812 B2 | 7/2004 | Anderson | 365/51 |
| 6,771,526 B2 | 8/2004 | LaBerge | 365/63 |
| 6,772,359 B2 | 8/2004 | Kwak et al. | 713/500 |
| 6,779,097 B2 | 8/2004 | Gillingham et al. | 711/167 |
| 6,785,767 B2 | 8/2004 | Coulson | 711/112 |
| 6,791,877 B2 | 9/2004 | Miura et al. | 365/185 |
| 6,795,899 B2 | 9/2004 | Dodd et al. | 711/137 |
| 6,799,241 B2 | 9/2004 | Kahn et al. | 711/105 |
| 6,801,989 B2 | 10/2004 | Johnson et al. | 711/167 |
| 6,807,598 B2 | 10/2004 | Farmwald et al. | 710/305 |
| 6,807,650 B2 | 10/2004 | Lamb et al. | |
| 6,807,655 B1 | 10/2004 | Rehani et al. | 716/4 |
| 6,816,991 B2 | 11/2004 | Sanghani | 714/733 |
| 6,819,602 B2 | 11/2004 | Seo et al. | 365/193 |
| 6,819,617 B2 | 11/2004 | Hwang et al. | 365/222 |
| 6,820,163 B1 | 11/2004 | McCall et al. | 710/310 |
| 6,820,169 B2 | 11/2004 | Wilcox et al. | 711/105 |
| 6,826,104 B2 | 11/2004 | Kawaguchi et al. | 365/222 |
| 6,839,290 B2 | 1/2005 | Ahmad et al. | 365/193 |
| 6,844,754 B2 | 1/2005 | Yamagata | |
| 6,845,027 B2 | 1/2005 | Mayer et al. | |
| 6,845,055 B1 | 1/2005 | Koga et al. | 365/229 |
| 6,847,582 B2 | 1/2005 | Pan | 365/233 |
| 6,850,449 B2 | 2/2005 | Takahashi | 365/222 |
| 6,854,043 B2 | 2/2005 | Hargis et al. | |
| 6,862,202 B2 | 3/2005 | Schaefer | 365/52 |
| 6,862,249 B2 | 3/2005 | Kyung | 365/233 |
| 6,862,653 B1 | 3/2005 | Dodd et al. | 711/105 |
| 6,873,534 B2 | 3/2005 | Bhakta et al. | 365/63 |
| 6,878,570 B2 | 4/2005 | Lyu et al. | |
| 6,894,933 B2 | 5/2005 | Kuzmenka et al. | 365/189 |
| 6,898,683 B2 | 5/2005 | Nakamura | 711/167 |
| 6,908,314 B2 | 6/2005 | Brown | 439/68 |
| 6,912,778 B2 | 7/2005 | Ahn et al. | 29/852 |
| 6,914,786 B1 | 7/2005 | Paulsen et al. | |
| 6,917,219 B2 | 7/2005 | New | 326/41 |
| 6,922,371 B2 | 7/2005 | Takahashi et al. | 365/227 |
| 6,930,900 B2 | 8/2005 | Bhakta et al. | 365/51 |
| 6,930,903 B2 | 8/2005 | Bhakta et al. | 365/63 |
| 6,938,119 B2 | 8/2005 | Kohn et al. | 711/105 |
| 6,943,450 B2 | 9/2005 | Fee et al. | |
| 6,944,748 B2 | 9/2005 | Sanches et al. | |
| 6,951,982 B2 | 10/2005 | Chye et al. | |
| 6,961,281 B2 | 11/2005 | Wong et al. | 365/230 |
| 6,968,416 B2 | 11/2005 | Moy | 710/310 |
| 6,968,419 B1 | 11/2005 | Holman | 711/5 |
| 6,970,968 B1 | 11/2005 | Holman | 711/5 |
| 6,980,021 B1 | 12/2005 | Srivastava et al. | 326/30 |
| 6,986,118 B2 | 1/2006 | Dickman | 716/8 |
| 6,992,501 B2 | 1/2006 | Rapport | 326/30 |
| 6,992,950 B2 | 1/2006 | Foss et al. | 365/233 |
| 7,000,062 B2 | 2/2006 | Perego et al. | 711/5 |
| 7,003,618 B2 | 2/2006 | Perego et al. | 711/5 |
| 7,003,639 B2 | 2/2006 | Tsern et al. | 711/154 |
| 7,007,175 B2 | 2/2006 | Chang et al. | 713/300 |
| 7,010,642 B2 | 3/2006 | Perego et al. | 711/5 |
| 7,010,736 B1 | 3/2006 | Teh et al. | 714/733 |
| 7,024,518 B2 | 4/2006 | Halbert et al. | 711/115 |
| 7,026,708 B2 | 4/2006 | Cady et al. | |
| 7,028,234 B2 | 4/2006 | Huckaby et al. | 714/710 |
| 7,033,861 B1 | 4/2006 | Partridge et al. | 438/109 |
| 7,035,150 B2 | 4/2006 | Streif et al. | 365/194 |
| 7,043,599 B1 | 5/2006 | Ware et al. | 711/106 |
| 7,043,611 B2 | 5/2006 | McClannahan et al. | |
| 7,045,396 B2 | 5/2006 | Crowley et al. | |
| 7,045,901 B2 | 5/2006 | Lin et al. | |
| 7,046,538 B2 | 5/2006 | Kinsley et al. | 365/52 |
| 7,053,470 B1 | 5/2006 | Sellers et al. | |
| 7,053,478 B2 | 5/2006 | Roper et al. | |
| 7,058,776 B2 | 6/2006 | Lee | 711/167 |
| 7,058,863 B2 | 6/2006 | Kouchi et al. | 714/718 |
| 7,061,784 B2 | 6/2006 | Jakobs et al. | 365/51 |
| 7,061,823 B2 | 6/2006 | Faue et al. | 365/230 |
| 7,066,741 B2 | 6/2006 | Burns et al. | |
| 7,075,175 B2 | 7/2006 | Kazi et al. | 257/678 |
| 7,079,396 B2 | 7/2006 | Gates et al. | |
| 7,079,441 B1 | 7/2006 | Partsch et al. | 365/226 |
| 7,079,446 B2 | 7/2006 | Murtagh et al. | 365/233 |
| 7,085,152 B2 | 8/2006 | Ellis et al. | 365/149 |
| 7,085,941 B2 | 8/2006 | Li | 713/300 |
| 7,089,438 B2 | 8/2006 | Raad | 713/322 |
| 7,093,101 B2 | 8/2006 | Aasheim et al. | 711/207 |
| 7,103,730 B2 | 9/2006 | Saxena et al. | 711/156 |
| 7,110,322 B2 | 9/2006 | Farmwald et al. | |
| 7,119,428 B2 | 10/2006 | Tanie et al. | |
| 7,120,727 B2 | 10/2006 | Lee et al. | 711/5 |
| 7,126,399 B1 | 10/2006 | Lee | 327/261 |
| 7,133,960 B1 | 11/2006 | Thompson et al. | 711/5 |
| 7,136,978 B2 | 11/2006 | Miura et al. | 711/165 |
| 7,138,823 B2 * | 11/2006 | Janzen et al. | 326/30 |
| 7,149,145 B2 | 12/2006 | Kim et al. | 365/233 |
| 7,149,824 B2 | 12/2006 | Johnson | 710/35 |
| 7,173,863 B2 | 2/2007 | Conley et al. | 365/189 |
| 7,200,021 B2 | 4/2007 | Raghuram | 365/51 |
| 7,205,789 B1 | 4/2007 | Karabatsos | 326/30 |
| 7,224,595 B2 | 5/2007 | Dreps et al. | 365/63 |
| 7,228,264 B2 | 6/2007 | Barrenscheen et al. | 703/23 |
| 7,233,541 B2 | 6/2007 | Yamamoto et al. | 365/230.03 |
| 7,245,541 B2 | 7/2007 | Janzen | 365/198 |
| 7,254,036 B2 | 8/2007 | Pauley et al. | 361/721 |
| 7,266,639 B2 | 9/2007 | Raghuram | 711/115 |
| 7,269,042 B2 | 9/2007 | Kinsley et al. | 365/52 |
| 7,269,708 B2 | 9/2007 | Ware | 711/203 |
| 7,277,333 B2 | 10/2007 | Schaefer | |
| 7,286,436 B2 | 10/2007 | Bhakta et al. | 365/230 |
| 7,289,386 B2 | 10/2007 | Bhakta et al. | 365/230 |
| 7,296,754 B2 | 11/2007 | Nishizawa et al. | 235/492 |
| 7,299,330 B2 | 11/2007 | Gillingham et al. | 711/167 |
| 7,307,863 B2 | 12/2007 | Yen et al. | 365/63 |
| 7,317,250 B2 | 1/2008 | Koh et al. | |
| 7,327,613 B2 | 2/2008 | Lee | |
| 7,337,293 B2 | 2/2008 | Brittain et al. | |
| 7,363,422 B2 | 4/2008 | Perego et al. | 711/105 |
| 7,379,316 B2 | 5/2008 | Rajan | 365/63 |
| 7,386,656 B2 | 6/2008 | Rajan et al. | 711/103 |
| 7,392,338 B2 | 6/2008 | Rajan et al. | 711/103 |
| 7,408,393 B1 | 8/2008 | Jain et al. | 327/202 |
| 7,409,492 B2 | 8/2008 | Tanaka et al. | 711/103 |
| 7,414,917 B2 | 8/2008 | Ruckerbauer et al. | |
| 7,437,579 B2 | 10/2008 | Jeddeloh et al. | 713/300 |
| 7,441,064 B2 | 10/2008 | Gaskins | |
| 7,457,122 B2 | 11/2008 | Lai et al. | |
| 7,464,225 B2 | 12/2008 | Tsern | 711/115 |
| 7,472,220 B2 | 12/2008 | Rajan et al. | 711/103 |
| 7,480,147 B2 | 1/2009 | Hoss et al. | |
| 7,496,777 B2 | 2/2009 | Kapil | 713/324 |
| 7,515,453 B2 | 4/2009 | Rajan | 365/63 |
| 7,532,537 B2 | 5/2009 | Solomon et al. | 365/230 |
| 7,573,136 B2 | 8/2009 | Jiang et al. | |
| 7,581,121 B2 | 8/2009 | Barth et al. | |
| 7,613,880 B2 | 11/2009 | Miura et al. | |
| 7,619,912 B2 | 11/2009 | Bhakta et al. | |
| 7,724,589 B2 | 5/2010 | Rajan et al. | |
| 7,730,338 B2 | 6/2010 | Rajan et al. | |
| 7,761,724 B2 | 7/2010 | Rajan et al. | |
| 7,990,797 B2 | 8/2011 | Moshayedi et al. | |
| 8,116,144 B2 | 2/2012 | Shaw et al. | |
| 2001/0000822 A1 | 5/2001 | Dell et al. | 711/170 |
| 2001/0003198 A1 | 6/2001 | Wu | |
| 2001/0011322 A1 | 8/2001 | Stolt et al. | |
| 2001/0019509 A1 | 9/2001 | Aho et al. | |

(56) References Cited

U.S. PATENT DOCUMENTS

| | | |
|---|---|---|
| 2001/0021106 A1 | 9/2001 | Weber et al. |
| 2001/0021137 A1 | 9/2001 | Kai et al. .................. 365/222 |
| 2001/0046129 A1 | 11/2001 | Broglia et al. |
| 2001/0046163 A1 | 11/2001 | Yaganawa |
| 2001/0052062 A1 | 12/2001 | Lipovski |
| 2002/0002662 A1 | 1/2002 | Olarig et al. |
| 2002/0019961 A1 | 2/2002 | Blodgett .................. 714/718 |
| 2002/0034068 A1 | 3/2002 | Weber et al. |
| 2002/0038405 A1 | 3/2002 | Leddige et al. ............ 711/115 |
| 2002/0040416 A1 | 4/2002 | Tsern et al. |
| 2002/0041507 A1 | 4/2002 | Woo et al. .................. 365/51 |
| 2002/0051398 A1 | 5/2002 | Mizugaki .................. 365/222 |
| 2002/0060945 A1 | 5/2002 | Ikeda |
| 2002/0060948 A1 | 5/2002 | Chang et al. |
| 2002/0064073 A1 | 5/2002 | Chien ....................... 365/200 |
| 2002/0064083 A1 | 5/2002 | Ryu et al. .................. 365/233 |
| 2002/0089831 A1 | 7/2002 | Forthun |
| 2002/0094671 A1 | 7/2002 | Distefano et al. |
| 2002/0124195 A1 | 9/2002 | Nizar ......................... 713/320 |
| 2002/0129204 A1 | 9/2002 | Leighnor et al. |
| 2002/0145900 A1 | 10/2002 | Schaefer ..................... 365/52 |
| 2002/0165706 A1 | 11/2002 | Raynham .................... 703/25 |
| 2002/0167092 A1 | 11/2002 | Fee et al. |
| 2002/0172024 A1 | 11/2002 | Hui et al. |
| 2002/0174274 A1 | 11/2002 | Wu et al. .................. 710/100 |
| 2002/0184438 A1 | 12/2002 | Usui ............................ 711/106 |
| 2003/0002262 A1 | 1/2003 | Benisek et al. ............. 361/728 |
| 2003/0011993 A1 | 1/2003 | Summers et al. |
| 2003/0016550 A1 | 1/2003 | Yoo et al. |
| 2003/0021175 A1 | 1/2003 | Tae Kwak .................. 365/219 |
| 2003/0026155 A1 | 2/2003 | Yamagata |
| 2003/0035312 A1 | 2/2003 | Halbert et al. |
| 2003/0039158 A1 | 2/2003 | Horiguchi et al. ............ 365/200 |
| 2003/0061458 A1 | 3/2003 | Wilcox et al. ............... 711/167 |
| 2003/0061459 A1* | 3/2003 | Aboulenein et al. ......... 711/167 |
| 2003/0083855 A1 | 5/2003 | Fukuyama |
| 2003/0088743 A1 | 5/2003 | Rader |
| 2003/0093614 A1 | 5/2003 | Kohn et al. .................. 711/105 |
| 2003/0101392 A1 | 5/2003 | Lee ............................ 714/718 |
| 2003/0105932 A1 | 6/2003 | David et al. .................. 711/167 |
| 2003/0117875 A1 | 6/2003 | Lee et al. .................... 365/226 |
| 2003/0126338 A1 | 7/2003 | Dodd et al. .................. 710/305 |
| 2003/0127737 A1 | 7/2003 | Takahashi |
| 2003/0131160 A1 | 7/2003 | Hampel et al. ............... 710/22 |
| 2003/0145163 A1 | 7/2003 | Seo et al. ..................... 711/106 |
| 2003/0158995 A1 | 8/2003 | Lee et al. .................... 711/105 |
| 2003/0164539 A1 | 9/2003 | Yau |
| 2003/0164543 A1 | 9/2003 | Kheng Lee |
| 2003/0182513 A1 | 9/2003 | Dodd et al. .................. 711/137 |
| 2003/0183934 A1 | 10/2003 | Barrett |
| 2003/0189868 A1 | 10/2003 | Riesenman et al. .......... 365/226 |
| 2003/0189870 A1 | 10/2003 | Wilcox ......................... 365/233 |
| 2003/0191888 A1 | 10/2003 | Klein ........................... 711/105 |
| 2003/0191915 A1 | 10/2003 | Saxena et al. ............... 711/160 |
| 2003/0200382 A1 | 10/2003 | Wells et al. .................. 711/106 |
| 2003/0200474 A1 | 10/2003 | Li ................................ 713/320 |
| 2003/0205802 A1 | 11/2003 | Segaram et al. |
| 2003/0206476 A1 | 11/2003 | Joo ............................... 365/222 |
| 2003/0217303 A1 | 11/2003 | Chua-Eoan et al. ......... 713/600 |
| 2003/0223290 A1 | 12/2003 | Park et al. .................... 365/200 |
| 2003/0227798 A1 | 12/2003 | Pax ............................... 365/189 |
| 2003/0229821 A1 | 12/2003 | Ma ................................. 714/8 |
| 2003/0230801 A1 | 12/2003 | Jiang et al. |
| 2003/0231540 A1 | 12/2003 | Lazar et al. .................. 365/222 |
| 2003/0231542 A1 | 12/2003 | Zaharinova-Papazova et al. ............................ 365/226 |
| 2003/0234664 A1 | 12/2003 | Yamagata |
| 2004/0027902 A1 | 2/2004 | Ooishi et al. ................ 365/222 |
| 2004/0034732 A1 | 2/2004 | Valin et al. ..................... 714/4 |
| 2004/0037133 A1 | 2/2004 | Park et al. .................... 365/202 |
| 2004/0042503 A1 | 3/2004 | Shaeffer et al. |
| 2004/0044808 A1 | 3/2004 | Salmon et al. .................. 710/8 |
| 2004/0047228 A1 | 3/2004 | Chen ............................ 365/232 |
| 2004/0057317 A1 | 3/2004 | Schaefer ....................... 365/222 |
| 2004/0064647 A1 | 4/2004 | DeWhitt et al. .............. 711/135 |
| 2004/0064767 A1 | 4/2004 | Huckaby et al. .............. 714/710 |
| 2004/0083324 A1 | 4/2004 | Rabinovitz et al. |
| 2004/0088475 A1 | 5/2004 | Streif et al. ................... 711/105 |
| 2004/0100837 A1 | 5/2004 | Lee |
| 2004/0117723 A1 | 6/2004 | Foss ............................. 714/805 |
| 2004/0123173 A1 | 6/2004 | Emberling et al. ........... 714/733 |
| 2004/0125635 A1 | 7/2004 | Kuzmenka .................... 365/51 |
| 2004/0133736 A1 | 7/2004 | Kyung ......................... 711/105 |
| 2004/0139359 A1 | 7/2004 | Samson et al. ............... 713/320 |
| 2004/0145963 A1 | 7/2004 | Byon ............................ 365/233 |
| 2004/0151038 A1 | 8/2004 | Ruckerbauer et al. ........ 365/200 |
| 2004/0174765 A1 | 9/2004 | Seo et al. ..................... 365/233 |
| 2004/0177079 A1 | 9/2004 | Gluhovsky et al. ........... 707/100 |
| 2004/0178824 A1 | 9/2004 | Pan ................................. 326/93 |
| 2004/0184324 A1 | 9/2004 | Pax ............................... 365/189 |
| 2004/0186956 A1 | 9/2004 | Perego et al. ................. 711/115 |
| 2004/0188704 A1 | 9/2004 | Halbert et al. ................ 257/145 |
| 2004/0195682 A1 | 10/2004 | Kimura |
| 2004/0196732 A1 | 10/2004 | Lee ............................... 365/233 |
| 2004/0208173 A1 | 10/2004 | Di Gregorio ................. 370/360 |
| 2004/0228166 A1 | 11/2004 | Braun et al. ................. 365/154 |
| 2004/0228196 A1 | 11/2004 | Kwak et al. |
| 2004/0228203 A1 | 11/2004 | Koo ............................... 365/233 |
| 2004/0230932 A1 | 11/2004 | Dickmann .................... 716/10 |
| 2004/0250989 A1 | 12/2004 | Im et al. |
| 2004/0256638 A1 | 12/2004 | Perego et al. ................. 257/200 |
| 2004/0257847 A1 | 12/2004 | Matsui et al. ................. 365/63 |
| 2004/0257857 A1 | 12/2004 | Yamamoto et al. |
| 2004/0260957 A1 | 12/2004 | Jeddeloh et al. .............. 713/300 |
| 2004/0264255 A1 | 12/2004 | Royer ....................... 365/189.01 |
| 2004/0268161 A1 | 12/2004 | Ross .............................. 713/300 |
| 2005/0018495 A1 | 1/2005 | Bhakta et al. ................. 365/199 |
| 2005/0021874 A1 | 1/2005 | Georgiou et al. ............ 709/250 |
| 2005/0024963 A1 | 2/2005 | Jakobs et al. ................ 365/202 |
| 2005/0027928 A1 | 2/2005 | Avraham et al. ............. 711/103 |
| 2005/0028038 A1 | 2/2005 | Pomaranski et al. .......... 714/42 |
| 2005/0034004 A1 | 2/2005 | Bunker et al. |
| 2005/0036350 A1 | 2/2005 | So et al. ......................... 365/63 |
| 2005/0041504 A1 | 2/2005 | Perego et al. ................ 365/222 |
| 2005/0044302 A1 | 2/2005 | Pauley et al. |
| 2005/0044303 A1 | 2/2005 | Perego et al. .................... 711/5 |
| 2005/0044305 A1 | 2/2005 | Jakobs et al. ................ 711/105 |
| 2005/0047192 A1 | 3/2005 | Matsui et al. ................ 365/145 |
| 2005/0071543 A1 | 3/2005 | Ellis et al. .................... 711/106 |
| 2005/0078532 A1 | 4/2005 | Ruckerbauer et al. ........ 365/199 |
| 2005/0081085 A1 | 4/2005 | Ellis et al. ....................... 714/5 |
| 2005/0086548 A1 | 4/2005 | Haid et al. |
| 2005/0099834 A1 | 5/2005 | Funaba et al. ................. 365/63 |
| 2005/0102590 A1 | 5/2005 | Norris et al. .................. 714/719 |
| 2005/0105318 A1 | 5/2005 | Funaba et al. ................. 365/63 |
| 2005/0108460 A1 | 5/2005 | David |
| 2005/0127531 A1 | 6/2005 | Tay et al. |
| 2005/0132158 A1 | 6/2005 | Hampel et al. ............... 711/167 |
| 2005/0138267 A1 | 6/2005 | Bains et al. ................... 711/100 |
| 2005/0139977 A1 | 6/2005 | Nishio et al. |
| 2005/0141199 A1 | 6/2005 | Chiou et al. .................. 361/704 |
| 2005/0149662 A1 | 7/2005 | Perego ............................. 711/5 |
| 2005/0152212 A1 | 7/2005 | Yang et al. .................... 365/233 |
| 2005/0156934 A1 | 7/2005 | Perego et al. |
| 2005/0166026 A1 | 7/2005 | Ware et al. .................... 711/167 |
| 2005/0193163 A1 | 9/2005 | Perego ........................... 711/105 |
| 2005/0193183 A1 | 9/2005 | Barth et al. |
| 2005/0194991 A1 | 9/2005 | Dour et al. ..................... 326/30 |
| 2005/0195629 A1 | 9/2005 | Leddige et al. ................ 365/51 |
| 2005/0201063 A1 | 9/2005 | Lee et al. |
| 2005/0204111 A1 | 9/2005 | Natarajan ..................... 711/167 |
| 2005/0207255 A1 | 9/2005 | Perego et al. ................. 365/222 |
| 2005/0210196 A1 | 9/2005 | Perego et al. ................. 711/115 |
| 2005/0223179 A1 | 10/2005 | Perego et al. ................. 711/154 |
| 2005/0224948 A1 | 10/2005 | Lee et al. ..................... 257/686 |
| 2005/0235119 A1 | 10/2005 | Sechrest et al. .............. 711/158 |
| 2005/0235131 A1 | 10/2005 | Ware ............................. 711/203 |
| 2005/0237838 A1 | 10/2005 | Kwak et al. .................. 365/222 |
| 2005/0243635 A1 | 11/2005 | Schaefer |
| 2005/0246558 A1 | 11/2005 | Ku |
| 2005/0249011 A1 | 11/2005 | Maeda .......................... 365/222 |
| 2005/0259504 A1 | 11/2005 | Murtugh et al. .............. 365/233 |
| 2005/0263312 A1 | 12/2005 | Bolken et al. |
| 2005/0265506 A1 | 12/2005 | Foss et al. .................... 375/376 |

(56) References Cited

U.S. PATENT DOCUMENTS

| | | |
|---|---|---|
| 2005/0269715 A1 | 12/2005 | Yoo |
| 2005/0278474 A1 | 12/2005 | Perersen et al. ............... 711/5 |
| 2005/0281096 A1 | 12/2005 | Bhakta et al. |
| 2005/0281123 A1 | 12/2005 | Bell et al. ................. 365/230 |
| 2005/0283572 A1 | 12/2005 | Ishihara .................... 711/118 |
| 2005/0285174 A1 | 12/2005 | Saito et al. ............... 257/296 |
| 2005/0286334 A1 | 12/2005 | Saito et al. |
| 2005/0289292 A1 | 12/2005 | Morrow et al. ............ 711/105 |
| 2005/0289317 A1 | 12/2005 | Liou et al. ................. 711/170 |
| 2006/0002201 A1 | 1/2006 | Janzen .................... 365/191 |
| 2006/0010339 A1 | 1/2006 | Klein ........................ 714/5 |
| 2006/0026484 A1 | 2/2006 | Hollums ................. 714/746 |
| 2006/0038597 A1 | 2/2006 | Becker et al. |
| 2006/0039204 A1 | 2/2006 | Cornelius |
| 2006/0039205 A1 | 2/2006 | Cornelius ................ 365/189 |
| 2006/0041711 A1 | 2/2006 | Miura et al. .............. 711/103 |
| 2006/0041730 A1 | 2/2006 | Larson |
| 2006/0044909 A1 | 3/2006 | Kinsley et al. ........... 365/222 |
| 2006/0044913 A1 | 3/2006 | Klein et al. .............. 365/222 |
| 2006/0049502 A1 | 3/2006 | Goodwin et al. |
| 2006/0050574 A1 | 3/2006 | Streif et al. .............. 365/194 |
| 2006/0056244 A1 | 3/2006 | Ware ....................... 365/194 |
| 2006/0067141 A1 | 3/2006 | Perego et al. ............ 365/200 |
| 2006/0085616 A1 | 4/2006 | Zeighami et al. ........ 711/167 |
| 2006/0090031 A1 | 4/2006 | Kirshenbaum et al. ... 711/113 |
| 2006/0090054 A1 | 4/2006 | Choi et al. ............... 711/167 |
| 2006/0106951 A1 | 5/2006 | Bains ........................ 710/5 |
| 2006/0112214 A1 | 5/2006 | Yeh ........................... 711/103 |
| 2006/0117152 A1 | 6/2006 | Amidi et al. ............. 711/154 |
| 2006/0117160 A1 | 6/2006 | Jackson et al. ........... 711/170 |
| 2006/0118933 A1 | 6/2006 | Haba |
| 2006/0120193 A1 | 6/2006 | Casper ..................... 365/222 |
| 2006/0123265 A1 | 6/2006 | Ruckerbauer et al. .... 713/500 |
| 2006/0126369 A1 | 6/2006 | Raghuram ................ 365/51 |
| 2006/0129712 A1 | 6/2006 | Raghuram ................ 710/52 |
| 2006/0129740 A1* | 6/2006 | Ruckerbauer et al. ..... 711/5 |
| 2006/0129755 A1 | 6/2006 | Raghuram ............... 711/105 |
| 2006/0133173 A1 | 6/2006 | Jain et al. ................ 365/222 |
| 2006/0136791 A1 | 6/2006 | Nierle |
| 2006/0149982 A1 | 7/2006 | Vogt ........................ 713/320 |
| 2006/0174082 A1* | 8/2006 | Bellows et al. .......... 711/169 |
| 2006/0176744 A1 | 8/2006 | Stave ....................... 365/194 |
| 2006/0179333 A1 | 8/2006 | Brittain et al. ........... 713/320 |
| 2006/0179334 A1 | 8/2006 | Brittain et al. ........... 713/320 |
| 2006/0180926 A1 | 8/2006 | Mullen et al. |
| 2006/0181953 A1 | 8/2006 | Rotenberg et al. |
| 2006/0198178 A1 | 9/2006 | Kinsley et al. ............ 365/52 |
| 2006/0203590 A1 | 9/2006 | Mori et al. ............... 365/222 |
| 2006/0206738 A1 | 9/2006 | Jeddeloh et al. .......... 713/320 |
| 2006/0233012 A1 | 10/2006 | Sekiguchi et al. ......... 365/51 |
| 2006/0248261 A1* | 11/2006 | Jacob et al. ............... 711/1 |
| 2006/0248387 A1 | 11/2006 | Nicholson et al. ........ 714/22 |
| 2006/0262586 A1 | 11/2006 | Solomon et al. .......... 365/63 |
| 2006/0262587 A1 | 11/2006 | Matsui et al. |
| 2006/0294295 A1 | 12/2006 | Fukuzo .................... 711/105 |
| 2007/0050530 A1 | 3/2007 | Rajan ......................... 711/5 |
| 2007/0058471 A1 | 3/2007 | Rajan et al. .............. 365/222 |
| 2007/0070669 A1 | 3/2007 | Tsern ....................... 365/51 |
| 2007/0088995 A1 | 4/2007 | Tsern et al. |
| 2007/0106860 A1 | 5/2007 | Foster, Sr. et al. ........ 711/170 |
| 2007/0162700 A1 | 7/2007 | Fortin et al. .............. 711/118 |
| 2007/0188997 A1 | 8/2007 | Hockanson et al. |
| 2007/0192563 A1 | 8/2007 | Rajan et al. .............. 711/202 |
| 2007/0195613 A1 | 8/2007 | Rajan et al. ........... 365/189.05 |
| 2007/0216445 A1 | 9/2007 | Raghavan et al. ........ 326/83 |
| 2007/0247194 A1 | 10/2007 | Jain ........................... 326/87 |
| 2007/0279084 A1 | 12/2007 | Oh et al. |
| 2007/0288683 A1 | 12/2007 | Panabaker et al. ........ 711/101 |
| 2007/0288686 A1 | 12/2007 | Arcedera et al. ......... 711/103 |
| 2007/0288687 A1 | 12/2007 | Panabaker et al. ....... 711/103 |
| 2008/0025108 A1 | 1/2008 | Rajan et al. ........... 365/189.05 |
| 2008/0025122 A1 | 1/2008 | Schakel et al. ........... 365/222 |
| 2008/0025136 A1 | 1/2008 | Rajan et al. ........... 365/230.08 |
| 2008/0025137 A1 | 1/2008 | Rajan et al. .............. 365/239 |
| 2008/0027697 A1 | 1/2008 | Rajan et al. ............... 703/14 |
| 2008/0027702 A1 | 1/2008 | Rajan et al. ............... 703/21 |
| 2008/0027703 A1 | 1/2008 | Rajan et al. ............... 703/21 |
| 2008/0028136 A1 | 1/2008 | Schakel et al. ........... 711/106 |
| 2008/0031030 A1 | 2/2008 | Rajan et al. ............... 365/63 |
| 2008/0031072 A1 | 2/2008 | Rajan et al. .............. 365/227 |
| 2008/0037353 A1 | 2/2008 | Rajan et al. .............. 365/227 |
| 2008/0056014 A1 | 3/2008 | Rajan et al. ........... 365/189.03 |
| 2008/0062773 A1 | 3/2008 | Rajan et al. ........... 365/189.03 |
| 2008/0065820 A1 | 3/2008 | Gillingham et al. ...... 711/105 |
| 2008/0082763 A1 | 4/2008 | Rajan et al. .............. 711/154 |
| 2008/0086588 A1 | 4/2008 | Danilak et al. |
| 2008/0089034 A1 | 4/2008 | Hoss et al. |
| 2008/0115006 A1 | 5/2008 | Smith et al. .............. 713/601 |
| 2008/0120458 A1 | 5/2008 | Gillingham et al. ...... 711/105 |
| 2008/0123459 A1 | 5/2008 | Rajan et al. .............. 365/227 |
| 2008/0126624 A1 | 5/2008 | Prete et al. |
| 2008/0126690 A1 | 5/2008 | Rajan et al. .............. 711/105 |
| 2008/0155136 A1 | 6/2008 | Hishino |
| 2008/0195894 A1 | 8/2008 | Schreck et al. |
| 2008/0215832 A1 | 9/2008 | Allen et al. |
| 2008/0239857 A1 | 10/2008 | Rajan et al. .............. 365/227 |
| 2008/0239858 A1 | 10/2008 | Rajan et al. .............. 365/227 |
| 2008/0256282 A1 | 10/2008 | Guo et al. |
| 2009/0109613 A1 | 4/2009 | Legen et al. |
| 2009/0216939 A1 | 8/2009 | Smith et al. |
| 2009/0285031 A1 | 11/2009 | Rajan et al. |
| 2009/0290442 A1 | 11/2009 | Rajan |
| 2010/0005218 A1 | 1/2010 | Gower et al. |
| 2010/0020585 A1 | 1/2010 | Rajan |
| 2010/0257304 A1 | 10/2010 | Rajan et al. |
| 2010/0271888 A1 | 10/2010 | Rajan |
| 2010/0281280 A1 | 11/2010 | Rajan et al. |

FOREIGN PATENT DOCUMENTS

| | | | |
|---|---|---|---|
| DE | 102005036528 | 2/2007 | ............... G11C 7/10 |
| EP | 0644547 | 3/1995 | |
| JP | 62121978 | 6/1987 | ............. G06F 12/06 |
| JP | 01171047 | 7/1989 | ............. G06F 12/16 |
| JP | 03-029357 | 2/1991 | ............. H01L 27/04 |
| JP | 03029357 | 2/1991 | ............. H01L 21/822 |
| JP | 03/276487 | 12/1991 | ............. G11C 11/401 |
| JP | 03286234 | 12/1991 | ............. G06F 12/06 |
| JP | 05-298192 | 11/1993 | |
| JP | 07-141870 | 6/1995 | ............. G11C 11/407 |
| JP | 08/077097 | 3/1996 | ............. G06F 13/16 |
| JP | 08077097 | 3/1996 | ............. G06F 12/00 |
| JP | 11-149775 | 6/1999 | ............. G11C 11/407 |
| JP | 2002025255 | 1/2002 | ............... G11C 7/10 |
| JP | 3304893 B2 | 5/2002 | |
| JP | 04-327474 | 11/2004 | |
| JP | 2006236388 | 9/2006 | ............. G06F 12/00 |
| KI | 1020040062717 | 7/2004 | ............... G11C 5/02 |
| WO | WO 95/05676 | 2/1995 | ............. H01L 25/00 |
| WO | WO9900734 | 1/1999 | |
| WO | WO00/45270 | 8/2000 | |
| WO | WO01/90900 | 11/2001 | |
| WO | WO01/97160 | 12/2001 | |
| WO | WO2004/044754 | 5/2004 | |
| WO | WO2006/072040 | 7/2006 | |
| WO | WO 2007002324 | 1/2007 | ............. G11C 29/00 |
| WO | WO 2007/038225 | 4/2007 | |
| WO | WO2008063251 | 5/2008 | ............... G11C 5/14 |

OTHER PUBLICATIONS

Non-final Office Action from U.S. Appl. No. 11/461,430 mailed on Feb. 19, 2009.

Final Office Action from U.S. Appl. No. 11/461,435 mailed on Jan. 28, 2009.

Non-final Office Action from U.S. Appl. No. 11/461,437 mailed on Jan. 26, 2009.

Non-final Office Action from U.S. Appl. No. 11/939,432 mailed on Feb. 6, 2009.

Wu et al., "eNVy: A Non-Volatile, Main Memory Storage System," ASPLOS-VI Proceedings—Sixth International Conference on Architectural Support for Programming Languages and Operating

(56) References Cited

OTHER PUBLICATIONS

Systems, San Jose, California, Oct. 4-7, 1994. SIGARCH Computer Architecture News 22(Special Issue Oct. 1994).
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.
"BIOS and Kernel Developer's Guide (BKDG) for AMD Family 10h Processors," AMD, 31116 Rev 3.00, Sep. 7, 2007.
Written Opinion from PCT Application No. PCT/US06/24360 mailed on Jan. 8, 2007.
Preliminary Report on Patentability from PCT Application No. PCT/US06/24360 mailed on Jan. 10, 2008.
Written Opinion from International PCT Application No. PCT/US06/34390 mailed on Nov. 21, 2007.
International Search Report from PCT Application No. PCT/US06/34390 mailed on Nov. 21, 2007.
International Preliminary Examination Report from PCT application No. PCT/US2007/003460 mailed on Aug. 21, 2008.
Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Non-Final Office Action from U.S. Appl. No. 11/461,420 Dated Jul. 23, 2009.
Notice of Allowance from U.S. Appl. No. 11/461,430 Dated Sep. 10, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/858,518 Dated Aug. 14, 2009.
Non-Final Office Action from U.S. Appl. No. 11/929,500 Dated Oct. 13, 2009.
Notice of Allowance from U.S. Appl. No. 11/939,432 Dated Sep. 24, 2009.
Non-Final Office Action from U.S. Appl. No. 11/941,589 Dated Oct. 1, 2009.
Supplemental European Search Report and Search Opinion issued Sep. 21, 2009 in European Application No. 07870726.2, 8 pp.
Wu et al., "eNVy: A Non-Volatile, Main Memory Storage System", ASPLOS-VI Proceedings, Oct. 4-7, 1994, pp. 86-97.
German Office Action from German Patent Application No. 11 2006 002 300.4-55 Dated May 11, 2009 (With Translation).
Great Britain Office Action from GB Patent Application No. GB0800734.6 Dated Mar. 1, 2010.
Great Britain Office Action from GB Patent Application No. GB0803913.3 Dated Mar. 1, 2010.
International Preliminary Examination Report From PCT Application No. PCT/US07/016385 Dated Feb. 3, 2009.
Final Office Action from U.S. Appl. No. 11/461,420 Dated Apr. 28, 2010.
Final Office Action from U.S. Appl. No. 11/461,435 Dated May 13, 2010.
Final Office Action from U.S. Appl. No. 11/515,167 Dated Jun. 3, 2010.
Notice of Allowance from U.S. Appl. No. 11/515,223 Dated Jul. 30, 2010.
Notice of Allowance from U.S. Appl. No. 11/553,372 Dated Mar. 12, 2010.
Notice of Allowance from U.S. Appl. No. 11/553,372 Dated Aug. 4, 2010.
Final Office Action from U.S. Appl. No. 11/553,390 Dated Jun. 24, 2010.
Notice of Allowance from U.S. Appl. No. 11/553,399 Dated Mar. 22, 2010.
Notice of Allowance from U.S. Appl. No. 11/553,399 Dated Dec. 3, 2010.
Non-Final Office Action from U.S. Appl. No. 11/588,739 Dated Dec. 29, 2009.
Notice of Allowance from U.S. Appl. No. 11/611,374 Dated Apr. 5, 2010.
Notice of Allowance from U.S. Appl. No. 11/611,374 Dated Jul. 19, 2010.
Notice of Allowance from U.S. Appl. No. 11/611,374 Dated Oct. 29, 2010.
Final Office Action from U.S. Appl. No. 11/672,924 Dated Sep. 7, 2010.
Final Office Action from U.S. Appl. No. 11/702,960 Dated Jun. 21, 2010.
Non-Final Office Action from U.S. Appl. No. 11/702,981 Dated Mar. 11, 2009.
Notice of Allowance from U.S. Appl. No. 11/762,010 Dated Jul. 2, 2010.
Notice of Allowance from U.S. Appl. No. 11/762,010 Dated Oct. 22, 2010.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/763,365 Dated Jun. 29, 2010.
Notice of Allowance from U.S. Appl. No. 11/763,365 Dated Oct. 20, 2010.

(56) References Cited

OTHER PUBLICATIONS

Non-Final Office Action from U.S. Appl. No. 11/828,181 Dated Mar. 2, 2010.
Non-Final Office Action from U.S. Appl. No. 11/828,182 Dated Mar. 29, 2010.
Non-Final Office Action from U.S. Appl. No. 11/855,805 Dated Sep. 21, 2010.
Final Office Action from U.S. Appl. No. 11/858,518 Dated Apr. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Notice of Allowance from U.S. Appl. No. 11/929,320 Dated Sep. 29, 2010.
Final Office Action from U.S. Appl. No. 11/929,403 Dated Aug. 31, 2010.
Final Office Action from U.S. Appl. No. 11/929,417 Dated Aug. 31, 2010.
Non-Final Office Action from U.S. Appl. No. 11/929,432 Dated Jan. 14, 2010.
Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 7, 2010.
Final Office Action from U.S. Appl. No. 11/929,500 Dated Jun. 24, 2010.
Non-Final Office Action from U.S. Appl. No. 11/929,571 Dated Mar. 3, 2010.
Non-Final Office Action from U.S. Appl. No. 11/929,631 Dated Mar. 3, 2010.
Final Office Action from U.S. Appl. No. 11/929,631 Dated Nov. 18, 2010.
Non-Final Office Action from U.S. Appl. No. 11/929,636 Dated Mar. 9, 2010.
Non-Final Office Action from U.S. Appl. No. 11/929,655 Dated Mar. 3, 2010.
Final Office Action from U.S. Appl. No. 11/929,655 Dated Nov. 22, 2010.
Non-Final Office Action from U.S. Appl. No. 11/939,432 Dated Apr. 12, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Notice of Allowance from U.S. Appl. No. 12/111,819 Dated Mar. 10, 2010.
Non-Final Office Action from U.S. Appl. No. 12/203,100 Dated Dec. 1, 2010.
Non-Final Office Action from U.S. Appl. No. 12/507,682 Dated Mar. 8, 2010.
Non-Final Office Action from U.S. Appl. No. 12/574,628 Dated Jun. 10, 2010.
Non-Final Office Action from U.S. Appl. No. 12/769,428 Dated Nov. 8, 2010.
Non-Final Office Action from U.S. Appl. No. 12/838,896 Dated Sep. 3, 2010.
Search Report From PCT Application No. PCT/US10/038041 Dated Aug. 23, 2010.
Non-Final Office Action from U.S. Appl. No. 11/461,437 Dated Jan. 4, 2011.
Notice of Allowance from U.S. Appl. No. 11/515,223 Dated Feb. 4, 2011.
Non-Final Office Action from U.S. Appl. No. 11/553,372 Dated Jan. 5, 2011.
Final Office Action from U.S. Appl. No. 11/588,739 Dated Dec. 15, 2010.
Notice of Allowance from U.S. Appl. No. 11/762,010 Dated Feb. 18, 2011.
Final Office Action from U.S. Appl. No. 11/828,182 Dated Dec. 22, 2010.
Non-Final Office Action from U.S. Appl. No. 11/855,826 Dated Jan. 13, 2011.
Notice of Allowance from U.S. Appl. No. 11/939,432 Dated Feb. 18, 2011.
Notice of Allowance from U.S. Appl. No. 12/144,396 Dated Feb. 1, 2011.
Non-Final Office Action from U.S. Appl. No. 12/816,756 Dated Feb. 7, 2011.
Notice of Allowance from U.S. Appl. No. 11/762,013 Dated Feb. 23, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Notice of Allowance from U.S. Appl. No. 12/838,896 Dated Apr. 19, 2011.
Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Notice of Allowance from U.S. Appl. No. 11/762,010 Dated Jun. 8, 2011.
Non-Final Office Action from U.S. Appl. No. 11/672,924 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.

(56) References Cited

OTHER PUBLICATIONS

Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Final Office Action from U.S. Appl. No. 11/855,805, Dated Jun. 14, 2012.
Office Action, including English translation, from co-pending Japanese application No. 2008-529353, Dated Jul. 31, 2012.
Final Office Action from U.S. Appl. No. 13/315,933, Dated Aug. 24, 2012.
Final Office Action from U.S. Appl. No. 13/276,212, Dated Aug. 30, 2012.
Non-Final Office Action from U.S. Appl. No. 13/367,182, Dated Aug. 31, 2012.
Non-Final Office Action from U.S. Appl. No. 11/553,372 Dated Nov. 14, 2011.
Notice of Allowance from U.S. Appl. No. 11/515,223 Dated Nov. 29, 2011.
Notice of Allowance from U.S. Appl. No. 12/769,428 Dated Nov. 29, 2011.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from related Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,924 Dated Feb. 16, 2012.
Final Office Action from U.S. Appl. No. 11/929,225 Dated Feb. 16, 2012.
International Search Report for Application No. EP12150807 Dated Feb. 16, 2012.
Final Office Action from U.S. Appl. No. 11/828,181 Dated Feb. 23, 2012.
Non-Final Office Action from U.S. Appl. No. 11/461,520 Dated Feb. 29, 2012.
Non-Final Office Action from U.S. Appl. No. 13/276,212 Dated Mar. 15, 2012.
Non-Final Office Action from U.S. Appl. No. 13/343,612 Dated Mar. 29, 2012.
Notice of Allowance from U.S. Appl. No. 11/939,440 Dated Mar. 30, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553,372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/672,924, Dated Feb. 1, 2013.
Non-Final Office Action from U.S. Appl. No. 13/260,650, Dated Feb. 1, 2013.
Notice of Allowance from U.S. Appl. No. 13/141,844, Dated Feb. 5, 2013.
Notice of Allowance from U.S. Appl. No. 13/473,827, Dated Feb. 15, 2013.
Notice of Allowance from U.S. Appl. No. 11/461,420, Dated Sep. 5, 2012.
Final Office Action from U.S. Appl. No. 13/280,251, Dated Sep. 12, 2012.
Non-Final Office Action from U.S. Appl. No. 11/929,225, Dated Sep. 17, 2012.
Notice of Allowance from U.S. Appl. No. 12/508,496, Dated Sep. 17, 2012.
Notice of Allowance from U.S. Appl. No. 12/057,306, Dated Oct. 10, 2012.
Notice Allowance from U.S. Appl. No. 12/144,396, Dated Oct. 11, 2012.
Non-Final Office Action from U.S. Appl. No. 13/411,489, Dated Oct. 17, 2012.
Non-Final Office Action from U.S. Appl. No. 13/471,283, Dated Dec. 7, 2012.
Office Action, including English translation, from co-pending Japanese application No. 2008-529353, Dated Dec. 27, 2012.
Office Action from co-pending European patent application No. EP12150798, Dated Jan. 3, 2013.
Office Action from co-pending Korean patent application No. KR1020087005172, dated Dec. 20, 2012.
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.

(56) References Cited

OTHER PUBLICATIONS

Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 11/939,432 Mailed Dec. 1, 2009.
Notice of Allowance From U.S. Appl. No. 12/111,819 Mailed Nov. 20, 2009.
Notice of Allowance From U.S. Appl. No. 12/111,828 Mailed Dec. 15, 2009.

* cited by examiner

SYSTEM AND METHOD FOR REDUCING COMMAND SCHEDULING CONSTRAINTS OF MEMORY CIRCUITS

RELATED APPLICATION(S)

This application is a continuation-in-part of U.S. application Ser. No.: 11/461,437 filed Jul. 31, 2006, which is now U.S. Pat. No. 8,077,535, U.S. application Ser. No. 11/702,981 filed Feb. 05, 2007, which is now U.S. Pat. No. 8,089,795, and U.S. application Ser. No. 11/702,960 filed Feb. 05, 2007 : and further claims the benefit of U.S. provisional application Ser. No.: 60/772,414 filed Feb. 9, 2006 and U.S. provisional application Ser. No.: 60/865,624 filed Nov. 13, 2006, which are each incorporated herein by reference in their entirety for all purposes. The present application is also related to U.S. application Ser. No. 11/672,924 filed Feb. 8, 2007 which names identical inventorship and is incorporated herein by reference in its entirety for all purposes.

FIELD OF THE INVENTION

The present invention relates to memory, and more particularly to command scheduling constraints of memory circuits.

BACKGROUND

Traditionally, memory circuit speeds have remained relatively constant, while the required data transfer speeds and bandwidth of memory systems have steadily increased. Thus, it has been necessary for more commands be scheduled, issued, and pipelined in a memory system in order to increase bandwidth. However, command scheduling constraints have customarily existed in memory systems which limit the command issue rates, and thus limit various attempts to further increase bandwidth, etc. There is thus a need for addressing these and/or other issues associated with the prior art.

SUMMARY

A memory circuit system and method are provided. An interface circuit is capable of communication with a plurality of memory circuits and a system. In use, the interface circuit is operable to interface the memory circuits and the system for reducing command scheduling constraints of the memory circuits.

DETAILED DESCRIPTION

Figure 1:
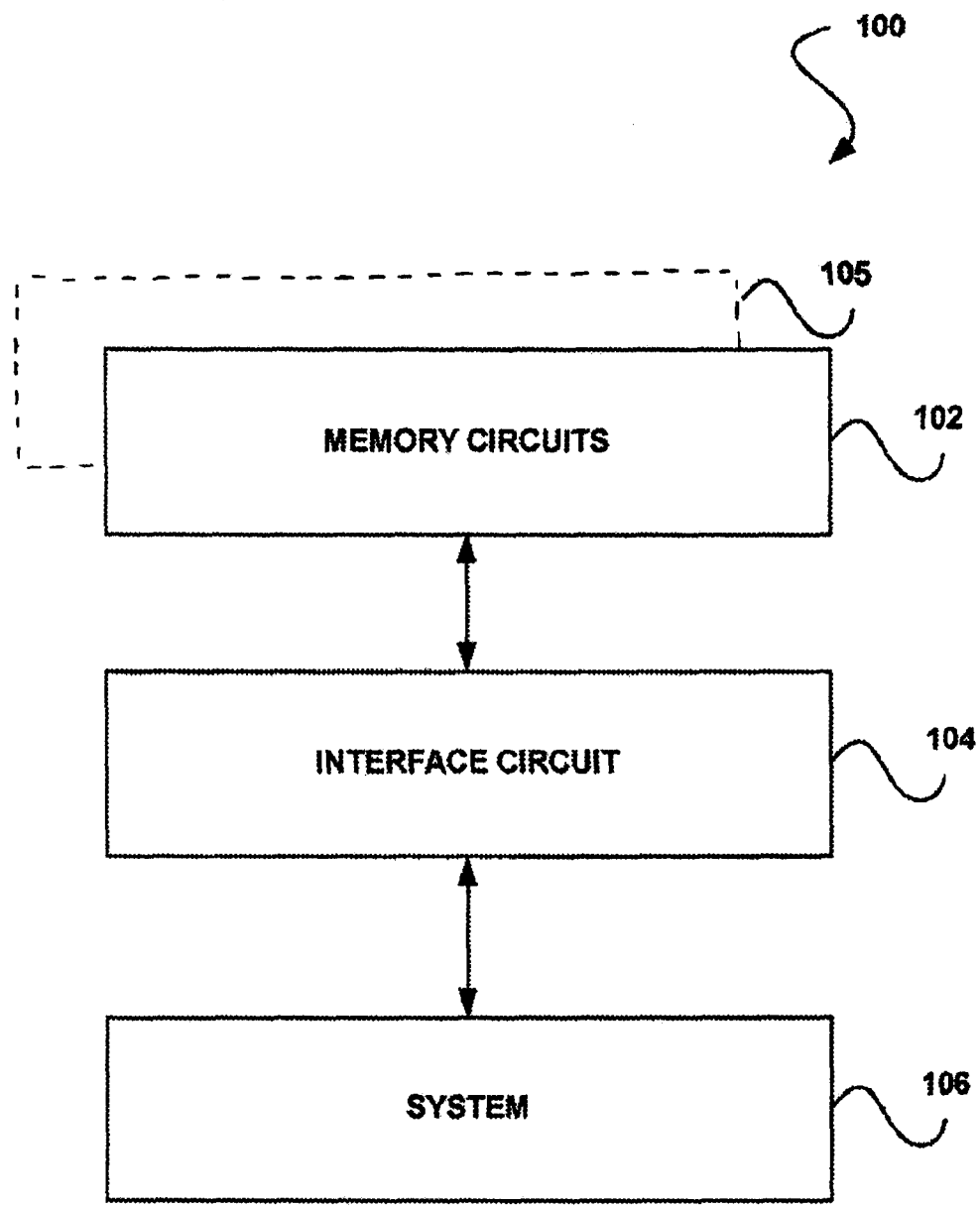
FIG. 1 illustrates a system for interfacing memory circuits, in accordance with one embodiment.

FIG. 1 illustrates a system 100 for interfacing memory circuits, in accordance with one embodiment. As shown, the system 100 includes an interface circuit 104 in communication with a plurality of memory circuits 102 and a system 106. In the context of the present description, such memory circuits 102 may include any circuits capable of serving as memory.

For example, in various embodiments, at least one of the memory circuits 102 may include a monolithic memory circuit, a semiconductor die, a chip, a packaged memory circuit, or any other type of tangible memory circuit. In one embodiment, the memory circuits 102 may take the form of dynamic random access memory (DRAM) circuits. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), and/or any other type of DRAM.

In another embodiment, at least one of the memory circuits 102 may include magnetic random access memory (MRAM), intelligent random access memory (IRAM), distributed network architecture (DNA) memory, window random access memory (WRAM), flash memory (e.g. NAND, NOR, etc.) pseutostatic random access memory (PSRAM), wetware memory, memory based on semiconductor, atomic, molecular, optical, organic, biological, chemical, or nanoscale technology, and/or any other type of volatile or nonvolatile, random or non-random access, serial or parallel access memory circuit.

Strictly as an option, the memory circuits 102 may or may not be positioned on at least one dual in-line memory module (DIMM) (not shown). In various embodiments, the DIMM may include a registered DIMM (R-DIMM), a small outline-DIMM (SO-DIMM), a fully buffered DIMM (FB-DIMM), an unbuffered DIMM (UDIMM), single inline memory module (SIMM), a MiniDIMM, a very low profile (VLP) R-DIMM, etc. In other embodiments, the memory circuits 102 may or may not be positioned on any type of material forming a substrate, card, module, sheet, fabric, board, carrier or any other type of solid or flexible entity, form, or object. Of course, in yet other embodiments, the memory circuits 102 may or may not be positioned in or on any desired entity, form, or object for packaging purposes. Still yet, the memory circuits 102 may or may not be organized into ranks. Such ranks may refer to any arrangement of such memory circuits 102 on any of the foregoing entities, forms, objects, etc.

Further, in the context of the present description, the system 106 may include any system capable of requesting and/or initiating a process that results in an access of the memory circuits 102. As an option, the system 106 may accomplish this utilizing a memory controller (not shown), or any other desired mechanism. In one embodiment, such system 106 may include a system in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The interface circuit 104 may, in the context of the present description, refer to any circuit capable of interfacing (e.g. communicating, buffering, etc.) with the memory circuits 102 and the system 106. For example, the interface circuit 104 may, in the context of different embodiments, include a circuit capable of directly (e.g. via wire, bus, connector, and/or any other direct communication medium, etc.) and/or indirectly (e.g. via wireless, optical, capacitive, electric field, magnetic field, electromagnetic field, and/or any other indirect communication medium, etc.) communicating with the memory circuits 102 and the system 106. In additional different embodiments, the communication may use a direct connection (e.g. point-to-point, single-drop bus, multi-drop bus, serial bus, parallel bus, link, and/or any other direct connection, etc.) or may use an indirect connection (e.g. through intermediate circuits, intermediate logic, an intermediate bus or busses, and/or any other indirect connection, etc.).

In additional optional embodiments, the interface circuit 104 may include one or more circuits, such as a buffer (e.g. buffer chip, etc.), a register (e.g. register chip, etc.), an advanced memory buffer (AMB) (e.g. AMB chip, etc.), a component positioned on at least one DIMM, a memory controller, etc. Moreover, the register may, in various embodiments, include a JEDEC Solid State Technology Association (known as JEDEC) standard register (a JEDEC register), a register with forwarding, storing, and/or buffering capabilities, etc. In various embodiments, the register chips, buffer chips, and/or any other interface circuit 104 may be intelligent, that is, include logic that is capable of one or more functions such as gathering and/or storing information, inferring, predicting, and/or storing state and/or status; performing logical decisions; and/or performing operations on input signals, etc. In still other embodiments, the interface circuit 104 may optionally be manufactured in monolithic form, packaged form, printed form, and/or any other manufactured form of circuit, for that matter. Furthermore, in another embodiment, the interface circuit 104 may be positioned on a DIMM.

In still yet another embodiment, a plurality of the aforementioned interface circuit 104 may serve, in combination, to interface the memory circuits 102 and the system 106. Thus, in various embodiments, one, two, three, four, or more interface circuits 104 may be utilized for such interfacing purposes. In addition, multiple interface circuits 104 may be relatively configured or connected in any desired manner. For example, the interface circuits 104 may be configured or connected in parallel, serially, or in various combinations thereof. The multiple interface circuits 104 may use direct connections to each other, indirect connections to each other, or even a combination thereof. Furthermore, any number of the interface circuits 104 may be allocated to any number of the memory circuits 102. In various other embodiments, each of the plurality of interface circuits 104 may be the same or different. Even still, the interface circuits 104 may share the same or similar interface tasks and/or perform different interface tasks.

While the memory circuits 102, interface circuit 104, and system 106 are shown to be separate parts, it is contemplated that any of such parts (or portion(s) thereof) may be integrated in any desired manner. In various embodiments, such optional integration may involve simply packaging such parts together (e.g. stacking the parts to form a stack of DRAM circuits, a DRAM stack, a plurality of DRAM stacks, a hardware stack, where a stack may refer to any bundle, collection, or grouping of parts and/or circuits, etc.) and/or integrating them monolithically. Just by way of example, in one optional embodiment, at least one interface circuit 104 (or portion(s) thereof) may be packaged with at least one of the memory circuits 102. In this way, the interface circuit 104 and the memory circuits 102 may take the form of a stack, in one embodiment.

For example, a DRAM stack may or may not include at least one interface circuit 104 (or portion(s) thereof). In other embodiments, different numbers of the interface circuit 104 (or portion(s) thereof) may be packaged together. Such different packaging arrangements, when employed, may optionally improve the utilization of a monolithic silicon implementation, for example.

The interface circuit 104 may be capable of various functionality, in the context of different optional embodiments. Just by way of example, the interface circuit 104 may or may not be operable to interface a first number of memory circuits 102 and the system 106 for simulating a second number of memory circuits 105 to the system 106. In the illustrated figure, the second number of memory circuits 105 is shown with a dashed border to indicate that its memory circuits are simulated. The first number of memory circuits 102 shall hereafter be referred to, where appropriate for clarification purposes, as the "physical" memory circuits 102 or memory circuits, but are not limited to be so. Just by way of example, the physical memory circuits 102 may include a single physical memory circuit. Further, the at least one simulated memory circuit seen by the system 106 shall hereafter be referred to, where appropriate for clarification purposes, as the at least one "virtual" memory circuit.

In still additional aspects of the present embodiment, the second number of virtual memory circuits may be more than, equal to, or less than the first number of physical memory circuits 102. Just by way of example, the second number of virtual memory circuits may include a single memory circuit. Of course, however, any number of memory circuits may be simulated.

In the context of the present description, the term simulated may refer to any simulating, emulating, disguising, transforming, modifying, changing, altering, shaping, converting, etc., which results in at least one aspect of the memory circuits 102 appearing different to the system 106. In different embodiments, such aspect may include, for example, a number, a signal, a memory capacity, a timing, a latency, a design parameter, a logical interface, a control system, a property, a behavior, and/or any other aspect, for that matter.

In different embodiments, the simulation may be electrical in nature, logical in nature, protocol in nature, and/or performed in any other desired manner. For instance, in the context of electrical simulation, a number of pins, wires, signals, etc. may be simulated. In the context of logical simulation, a particular function or behavior may be simulated. In the context of protocol, a particular protocol (e.g. DDR3, etc.) may be simulated. Further, in the context of protocol, the simulation may effect conversion between different protocols (e.g. DDR2 and DDR3) or may effect conversion between different versions of the same protocol (e.g. conversion of 4-4-4 DDR2 to 6-6-6 DDR2).

More illustrative information will now be set forth regarding various optional architectures and uses in which the foregoing system may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
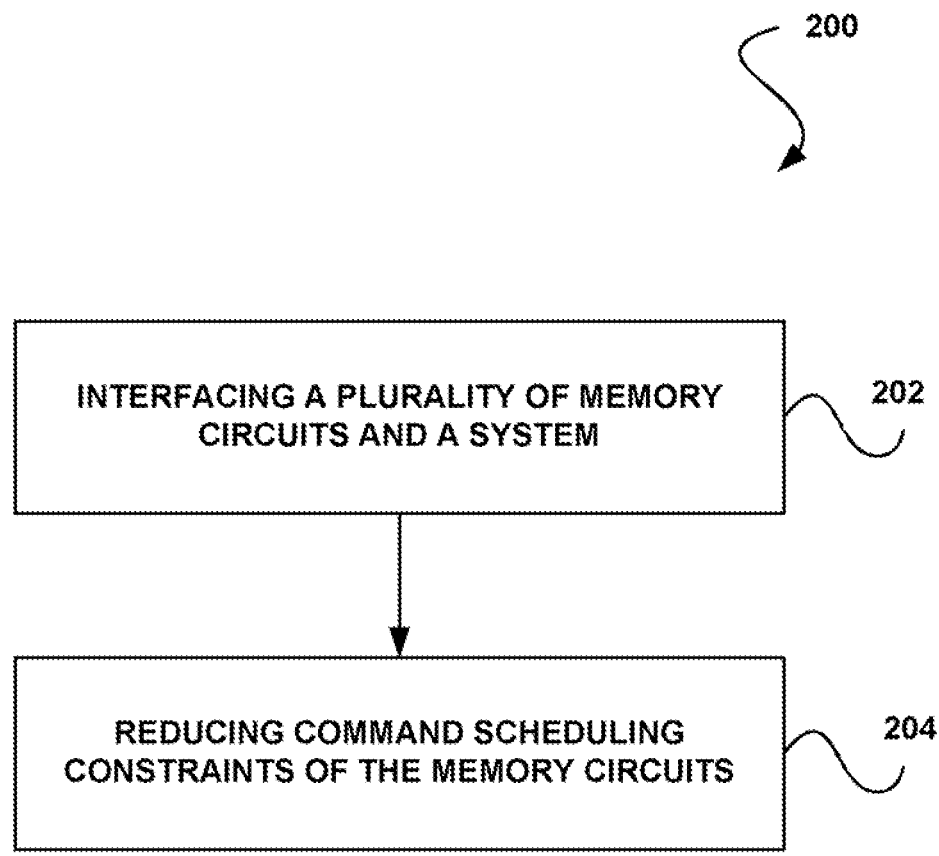
FIG. 2 illustrates a method for reducing command scheduling constraints of memory circuits, in accordance with another embodiment.

FIG. 2 illustrates a method 200 for reducing command scheduling constraints of memory circuits, in accordance with another embodiment. As an option, the method 200 may be implemented in the context of the system 100 of FIG. 1. Of course, however, the method 200 may be implemented in any desired environment. Further, the aforementioned definitions may equally apply to the description below.

As shown in operation 202, a plurality of memory circuits and a system are interfaced. In one embodiment, the memory circuits and system may be interfaced utilizing an interface circuit. The interface circuit may include, for example, the interface circuit described above with respect to FIG. 1. In addition, in one embodiment, the interfacing may include facilitating communication between the memory circuits and the system. Of course, however, the memory circuits and system may be interfaced in any desired manner.

Further, command scheduling constraints of the memory circuits are reduced, as shown in operation 204. In the context of the present description, the command scheduling constraints include any limitations associated with scheduling (and/or issuing) commands with respect to the memory circuits. Optionally, the command scheduling constraints may be defined by manufacturers in their memory device data sheets, by standards organizations such as the JEDEC, etc.

In one embodiment, the command scheduling constraints may include intra-device command scheduling constraints. Such intra-device command scheduling constraints may include scheduling constraints within a device. For example, the intra-device command scheduling constraints may include a column-to-column delay time (tCCD), row-to-row activation delay time (tRRD), four-bank activation window time (tFAW), write-to-read turn-around time (tWTR), etc. As an option, the intra-device command-scheduling constraints may be associated with parts (e.g. column, row, bank, etc.) of a device (e.g. memory circuit) that share a resource within the memory circuit. One example of such intra-device command scheduling constraints will be described in more detail below with respect to FIG. 5 during the description of a different embodiment.

In another embodiment, the command scheduling constraints may include inter-device command scheduling constraints. Such inter-device scheduling constraints may include scheduling constraints between memory circuits. Just by way of example, the inter-device command scheduling constraints may include rank-to-rank data bus turn-around times, on-die-termination (ODT) control switching times, etc. Optionally, the inter-device command scheduling constraints may be associated with memory circuits that share a resource (e.g. a data bus, etc.) which provides a connection therebetween (e.g. for communicating, etc.). One example of such inter-device command scheduling constraints will be described in more detail below with respect to FIG. 6 during the description of a different embodiment.

Further, reduction of the command scheduling restraints may include complete elimination and/or any decrease thereof. Still yet, in one optional embodiment, the command scheduling constraints may be reduced by controlling the manner in which commands are issued to the memory circuits. Such commands may include, for example, row-access commands, column-access commands, etc. Moreover, in additional embodiments, the commands may optionally be issued to the memory circuits utilizing separate buses associated therewith. One example of memory circuits associated with separate buses will be described in more detail below with respect to FIG. 8 during the description of a different embodiment.

In one possible embodiment, the command scheduling constraints may be reduced by issuing commands to the memory circuits based on simulation of a virtual memory circuit. For example, the plurality of physical memory circuits and the system may be interfaced such that the memory circuits appear to the system as a virtual memory circuit. Such simulated virtual memory circuit may optionally include the virtual memory circuit described above with respect to FIG. 1.

In addition, the virtual memory circuit may have less command scheduling constraints than the physical memory circuits. For example, in one exemplary embodiment, the physical memory circuits may appear as a group of one or more virtual memory circuits that are free from command scheduling constraints. Thus, as an option, the command scheduling constraints may be reduced by issuing commands directed to a single virtual memory circuit, to a plurality of different physical memory circuits. In this way, idle data-bus cycles may optionally be eliminated and memory system bandwidth may be increased.

Of course, it should be noted that the command scheduling constraints may be reduced in any desired manner. Accordingly, in one embodiment, the interface circuit may be utilized to eliminate, at least in part, inter-device and/or intra-device command scheduling constraints of memory circuits. Furthermore, reduction of the command scheduling constraints of the memory circuits may result in increased command issue rates. For example, a greater amount of commands may be issued to the memory circuits by reducing limitations associated with the command scheduling constraints. More information regarding increasing command issue rates by reducing command scheduling constraints will be described with respect to FIG. 11 during the description of a different embodiment.

Figure 3:
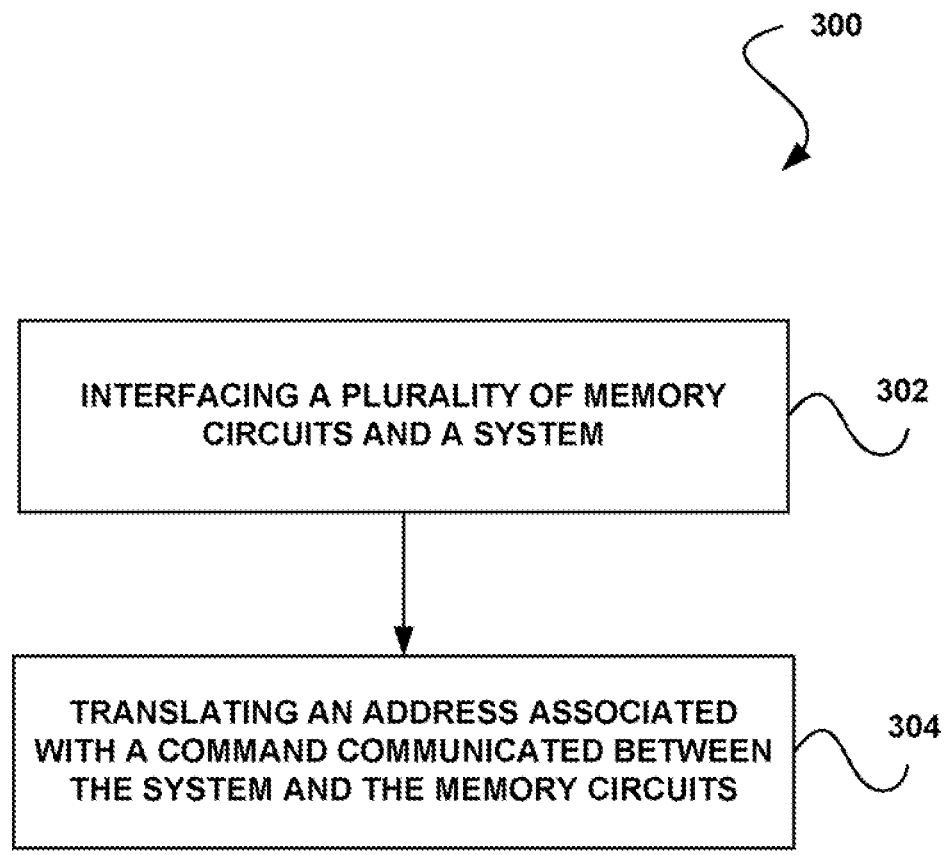
FIG. 3 illustrates a method for translating an address associated with a command communicated between a system and memory circuits, in accordance with yet another embodiment.

FIG. 3 illustrates a method 300 for translating an address associated with a command communicated between a system and memory circuits, in accordance with yet another embodiment. As an option, the method 300 may be carried out in context of the architecture and environment of FIGS. 1 and/or 2. Of course, the method 300 may be carried out in any desired environment. Further, the aforementioned definitions may equally apply to the description below.

As shown in operation 302, a plurality of memory circuits and a system are interfaced. In one embodiment, the memory circuits and system may be interfaced utilizing an interface circuit, such as that described above with respect to FIG. 1, for example. In one embodiment, the interfacing may include facilitating communication between the memory circuits and the system. Of course, however, the memory cicuits and system may be interfaced in any desired manner.

Additionally, an address associated with a command communicated between the system and the memory circuits is translated, as shown in operation 304. Such command may include, for example, a row-access command, a column-access command, and/or any other command capable of being communicated between the system and the memory circuits. As an option, the translation may be transparent to the system. In this way, the system may issue a command to the memory circuits, and such command may be translated without knowledge and/or input by the system. Of course, embodiments are contemplated where such transparency is non-existent, at least in part.

Further, the address may be translated in any desired manner. In one embodiment, the translation of the address may include shifting the address. In another embodiment, the address may be translated by mapping the address. Optionally, as described above with respect to FIGS. 1 and/or 2, the memory circuits may include physical memory circuits and the interface circuit may simulate at least one virtual memory circuit. To this end, the virtual memory circuit may optionally have a different (e.g. greater, etc.) number of row addresses associated therewith than the physical memory circuits.

Thus, in one possible embodiment, the translation may be performed as a function of the difference in the number of row addresses. For example, the translation may translate the address to reflect the number of row addresses of the virtual memory circuit. In still yet another embodiment, the translation may optionally translate the address as a function of a column address and a row address.

Thus, in one exemplary embodiment where the command includes a row-access command, the translation may be performed as a function of an expected arrival time of a column-access command. In another exemplary embodiment, where the command includes a row-access command, the translation may ensure that a column-access command addresses an open bank. Optionally, the interface circuit may be operable to delay the command communicated between the system and the memory circuits. To this end, the translation may result in sub-row activation of the memory circuits. Various examples of address translation will be described in more detail below with respect to FIG. 8 and 12 during the description of different embodiments.

Accordingly, in one embodiment, address mapping may use shifting of an address from one command to another to allow the use of memory circuits with smaller rows to emulate a larger memory circuit with larger rows. Thus, sub-row activation may be provided. Such sub-row activation may also reduce power consumption and may optionally further improve performance, in various embodiments.

One exemplary embodiment will now be set forth. It should be strongly noted that the following example is set forth for illustrative purposes only and should not be construed as limiting in any manner whatsoever. Specifically, memory storage cells of DRAM devices may be arranged into multiple banks, each bank having multiple rows, and each row having multiple columns. The memory storage capacity of the DRAM device may be equal to the number of banks times the number of rows per bank times the number of column per row times the number of storage bits per column. In commodity DRAM devices (e.g. SDRAM, DDR, DDR2, DDR3, DDR4, GDDR2, GDDR3 and GDDR4 and SDRAM, etc.), the number of banks per device, the number of rows per bank, the number of columns per row, and the column sizes may be determined by a standards-forming committee, such as the Joint Electron Device Engineering Council (JEDEC).

For example, JEDEC standards require that a 1 gigabyte (Gb) DDR2 or DDR3 SDRAM device with a four-bit wide data bus have eight banks per device, 8192 rows per bank, 2048 columns per row, and four bits per column. Similarly, a 2 Gb device with a four-bit wide data bus has eight banks per device, 16384 rows per bank, 2048 columns per row, and four bits per column. A 4 Gb device with a four-bit wide data bus has eight banks per device, 32768 rows per bank, 2048 columns per row, and four bits per column. In the 1 Gb, 2 Gb and 4 Gb devices, the row size is constant, and the number of rows doubles with each doubling of device capacity. Thus, a 2 Gb or a 4 Gb device may be simulated, as described above, by using multiple 1 Gb and 2 Gb devices, and by directly translating row-activation commands to row-activation commands and column-access commands to column-access commands. In one embodiment, this emulation may be possible because the 1 Gb, 2 Gb, and 4 Gb devices have the same row size.

Figure 4:
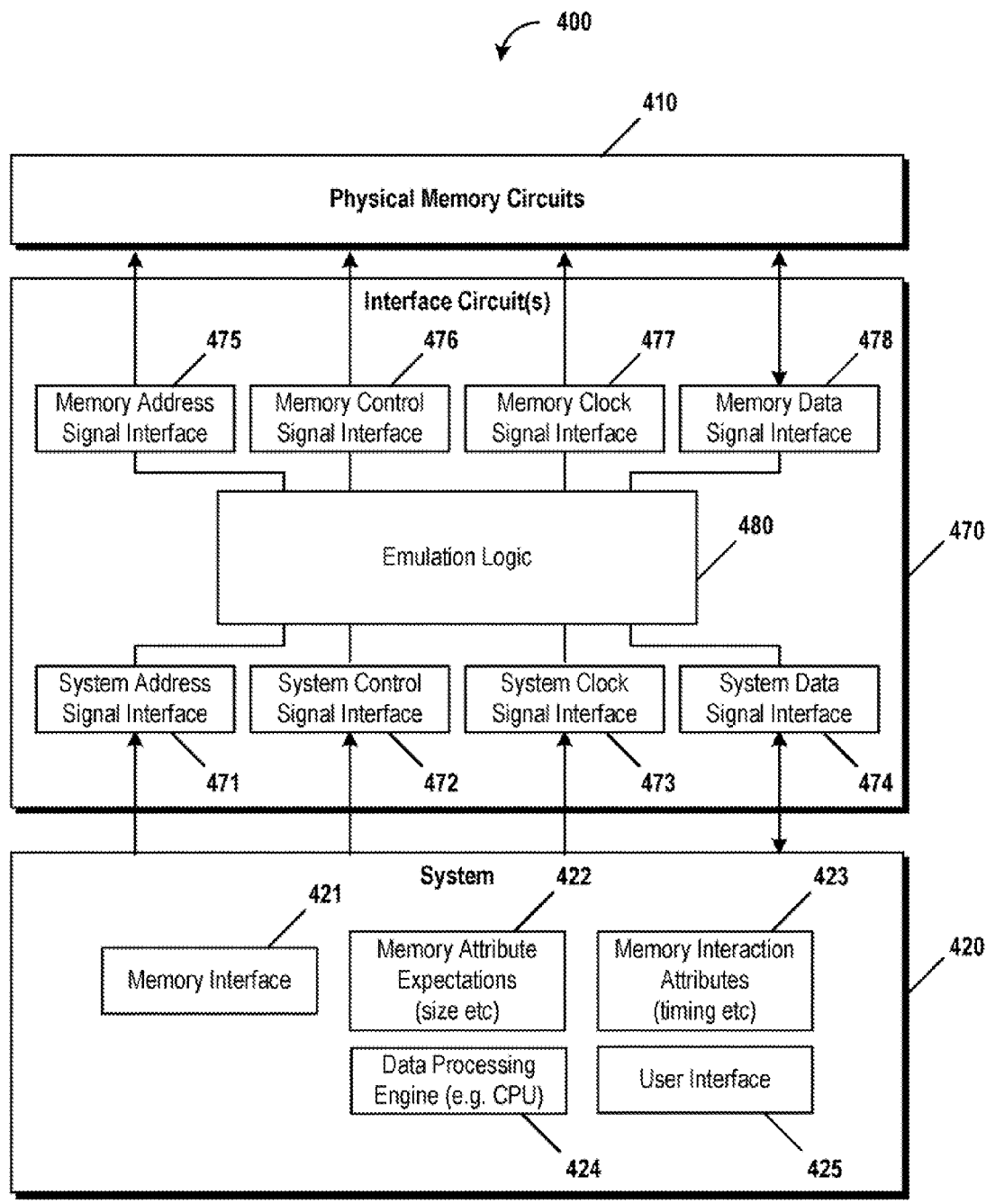
FIG. 4 illustrates a block diagram including logical components of a computer platform, in accordance with another embodiment.

FIG. 4 illustrates a block diagram including logical components of a computer platform 400, in accordance with another embodiment. As an option, the computer platform 400 may be implemented in context of the architecture and environment of FIGS. 1-3. Of course, the computer platform 400 may be implemented in any desired environment. Further, the aforementioned definitions may equally apply to the description below.

As shown, the computer platform 400 includes a system 420. The system 420 includes a memory interface 421, logic for retrieval and storage of external memory attribute expectations 422, memory interaction attributes 423, a data processing engine 424, and various mechanisms to facilitate a user interface 425. The computer platform 400 may be comprised of wholly separate components, namely a system 420 (e.g. a motherboard, etc.), and memory circuits 410 (e.g. physical memory circuits, etc.). In addition, the computer platform 400 may optionally include memory circuits 410 connected directly to the system 420 by way of one or more sockets.

In one embodiment, the memory circuits 410 may be designed to the specifics of various standards, including for example, a standard defining the memory circuits 410 to be JEDEC-compliant semiconductor memory (e.g. DRAM, SDRAM, DDR2, DDR3, etc.). The specifics of such standards may address physical interconnection and logical capabilities of the memory circuits 410.

In another embodiment, the system 420 may include a system BIOS program (not shown) capable of interrogating the physical memory circuits 410 (e.g. DIMMs) to retrieve and store memory attributes 422, 423. Further, various types of external memory circuits 410, including for example JEDEC-compliant DIMMs, may include an EEPROM device known as a serial presence detect (SPD) where the DIMM memory attributes are stored. The interaction of the BIOS with the SPD and the interaction of the BIOS with the memory circuit physical attributes may allow the system memory attribute expectations 422 and memory interaction attributes 423 become known to the system 420.

In various embodiments, the computer platform 400 may include one or more interface circuits 470 electrically disposed between the system 420 and the physical memory circuits 410. The interface circuit 470 may include several system-facing interfaces (e.g. a system address signal interface 471, a system control signal interface 472, a system clock signal interface 473, a system data signal interface 474, etc.). Similarly, the interface circuit 470 may include several memory-facing interfaces (e.g. a memory address signal interface 475, a memory control signal interface 476, a memory clock signal interface 477, a memory data signal interface 478, etc.).

Still yet, the interface circuit 470 may include emulation logic 480. The emulation logic 480 may be operable to receive and optionally store electrical signals (e.g. logic levels, commands, signals, protocol sequences, communications, etc.) from or through the system-facing interfaces, and may further be operable to process such electrical signals. The emulation logic 480 may respond to signals from system-facing interfaces by responding back to the system 420 and presenting signals to the system 420, and may also process the signals with other information previously stored. As another option, the emulation logic 480 may present signals to the physical memory circuits 410. Of course, however, the emulation logic 480 may perform any of the aforementioned functions in any order.

Moreover, the emulation logic 480 may be operable to adopt a personality, where such personality is capable of defining the physical memory circuit attributes. In various embodiments, the personality may be effected via any combination of bonding options, strapping, programmable strapping, the wiring between the interface circuit 470 and the physical memory circuits 410. Further, the personality may be effected via actual physical attributes (e.g. value of mode register, value of extended mode register) of the physical memory circuits 410 connected to the interface circuit 470 as determined when the interface circuit 470 and physical memory circuits 410 are powered up.

Figure 5:
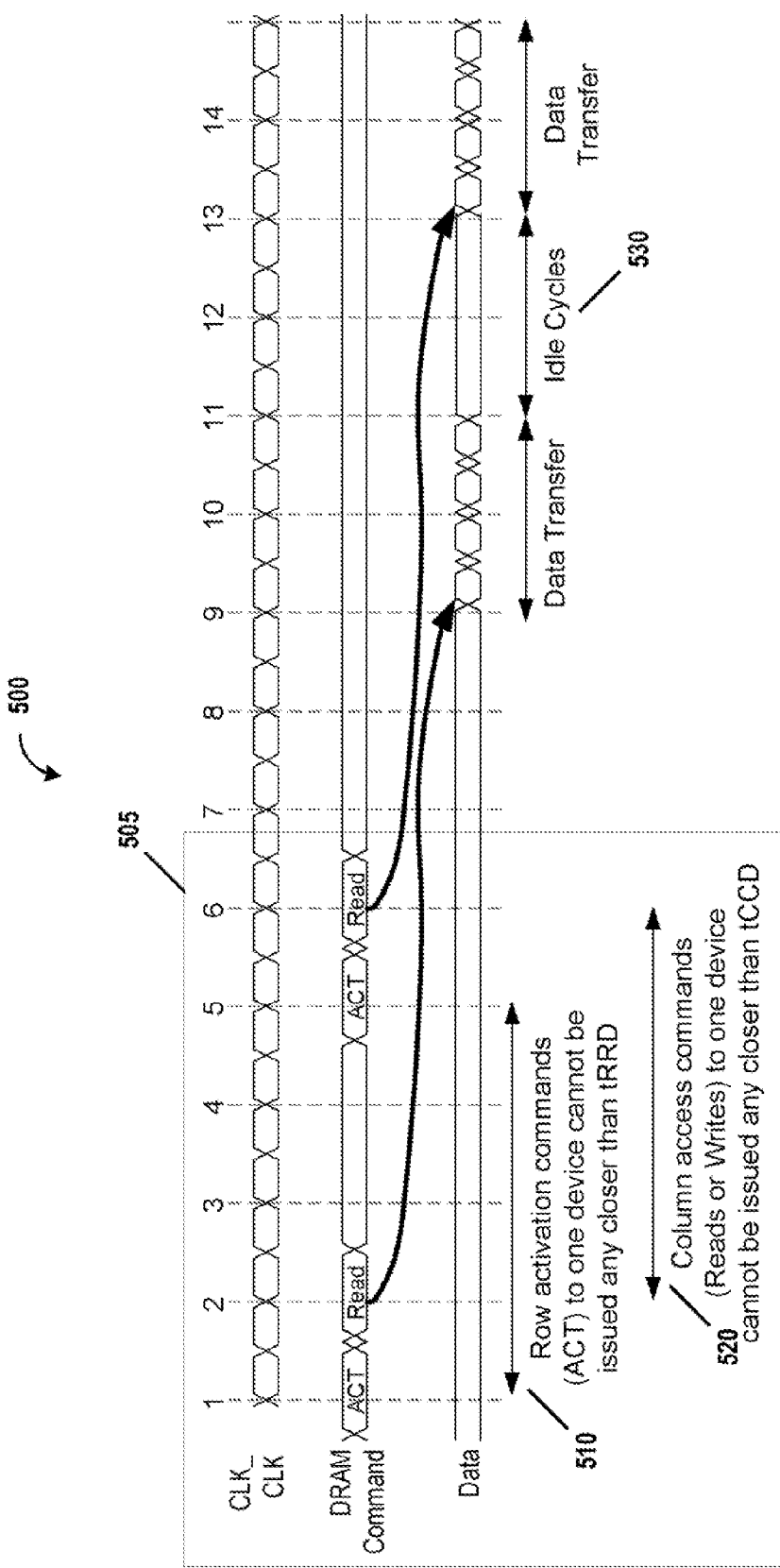
FIG. 5 illustrates a timing diagram showing an intra-device command sequence, intra-device timing constraints, and resulting idle cycles that prevent full use of bandwidth utilization in a DDR3 SDRAM memory system, in accordance with yet another embodiment.

FIG. 5 illustrates a timing diagram 500 showing an intra-device command sequence, intra-device timing constraints, and resulting idle cycles that prevent full use of bandwidth utilization in a DDR3 SDRAM memory system, in accordance with yet another embodiment. As an option, the timing diagram 50 may be associated with the architecture and environment of FIGS. 1-4. Of course, the timing diagram 500 may be associated with any desired environment. Further, the aforementioned definitions may equally apply to the description below.

As shown, the timing diagram 500 illustrates command cycles, timing constraints and idle cycles of memory. For example, in an embodiment involving DDR3 SDRAM memory systems, any two row-access commands directed to a single DRAM device may not necessarily be scheduled closer than tRRD. As another example, at most four row-access commands may be scheduled within tFAW to a single DRAM device. Moreover, consecutive column-read access commands and consecutive column-write access commands may not necessarily be scheduled to a given DRAM device any closer than tCCD, where tCCD equals four cycles (eight half-cycles of data) in DDR3 DRAM devices.

In the context of the present embodiment, row-access and/or row-activation commands are shown as ACT. In addition, column-access commands are shown as READ or WRITE. Thus, for example, in memory systems that require a data access in a data burst of four half-cycles, as shown in FIG. 2, the tCCD constraint may prevent column accesses from being scheduled consecutively. Further, the constraints 510, 520 imposed on the DRAM commands sent to a given DRAM device may restrict the command rate, resulting in idle cycles or bubbles 530 on the data bus, therefore reducing the bandwidth.

In another optional embodiment involving DDR3 SDRAM memory systems, consecutive column-access commands sent to different DRAM devices on the same data bus may not necessarily be scheduled any closer than a period that is the sum of the data burst duration plus additional idle cycles due to rank-to-rank data bus turn-around times. In the case of column-read access commands, two DRAM devices on the same data bus may represent two bus masters. Optionally, at least one idle cycle on the bus may be needed for one bus master to complete delivery of data to the memory controller and release control of the shared data bus, such that another bus master may gain control of the data bus and begin to send data.

Figure 6:
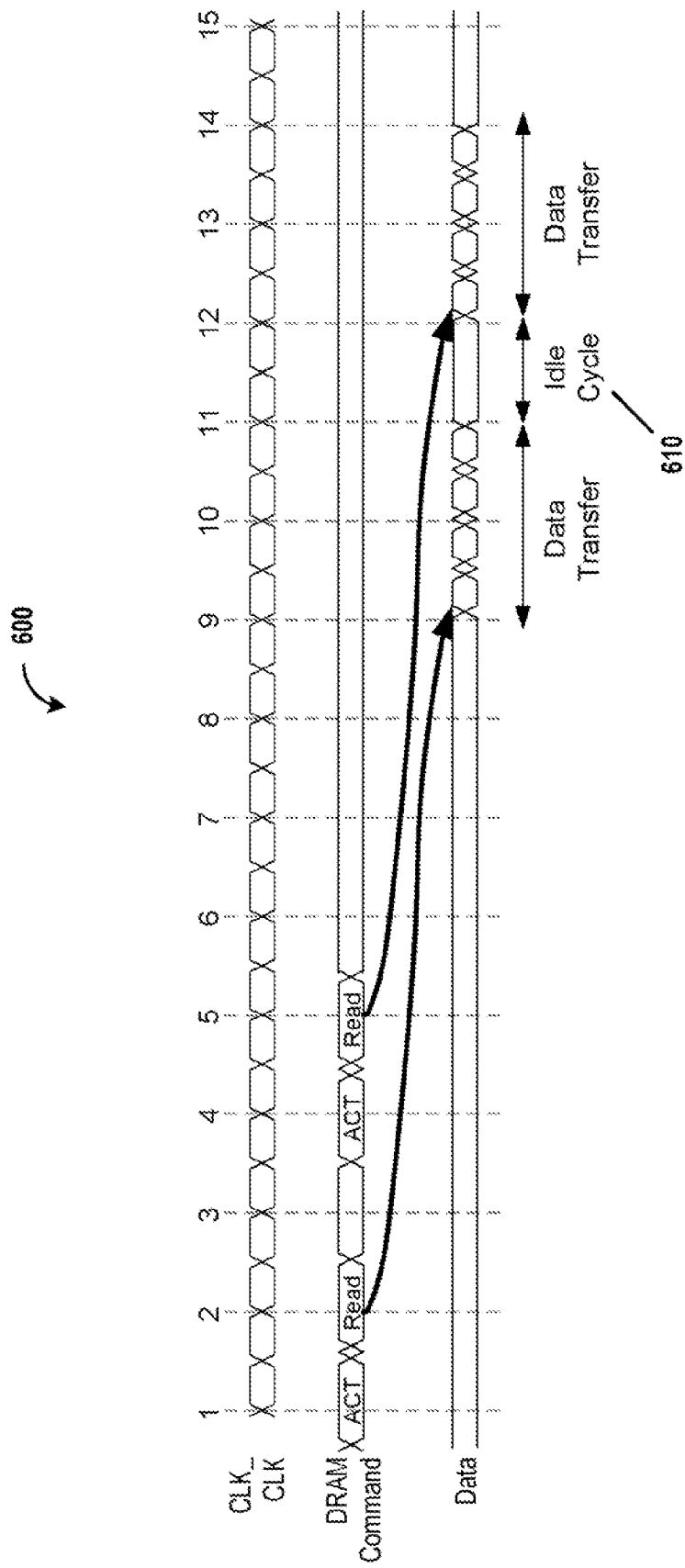
FIG. 6 illustrates a timing diagram showing an inter-device command sequence, inter-device timing constraints, and resulting idle cycles that prevent full use of bandwidth utilization in a DDR SDRAM, DDR2 SDRAM, or DDR3 SDRAM memory system, in accordance with still yet another embodiment.

FIG. 6 illustrates a timing diagram 600 showing inter-device command sequence, inter-device timing constraints, and resulting idle cycles that prevent full use of bandwidth utilization in a DDR SDRAM, DDR2 SDRAM, or DDR3 SDRAM memory system, in accordance with still yet another embodiment. As an option, the timing diagram 600 may be associated with the architecture and environment of FIGS. 1-4. Of course, the timing diagram 600 may be associated with any desired environment. Further, the aforementioned definitions may equally apply to the description below.

As shown, the timing diagram 600 illustrates commands issued to different devices that are free from constraints such as tRRD and tCCD which would otherwise be imposed on commands issue to the same device. However, as also shown, the data bus hand-off from one device to another device requires at least one idle data-bus cycle 610 on the data bus. Thus, the timing diagram 600 illustrates a limitation preventing full use of bandwidth utilization in a DDR3 SDRAM memory system. As a consequence of the command-scheduling constraints, there may be no available command sequence that allows full bandwidth utilization in a DDR3 SDRAM memory system, which also uses bursts shorter than tCCD.

Figure 7:
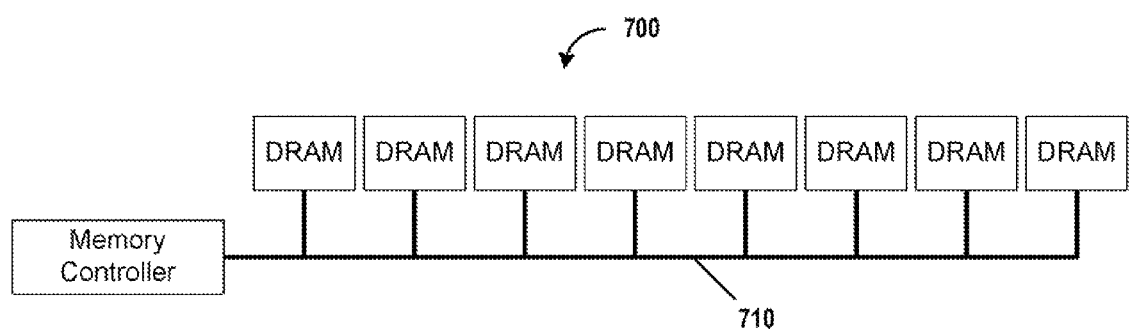
FIG. 7 illustrates a block diagram showing an array of DRAM devices connected to a memory controller, in accordance with another embodiment.

FIG. 7 illustrates a block diagram 700 showing an array of DRAM devices connected to a memory controller, in accordance with another embodiment. As an option, the block diagram 700 may be associated with the architecture and environment of FIGS. 1-6. Of course, the block diagram 700 may be associated with any desired environment. Further, the aforementioned definitions may equally apply to the description below.

As shown, eight DRAM devices are connected directly to a memory controller through a shared data bus 710. Accordingly, commands from the memory controller that are directed to the DRAM devices may be issued with respect to command scheduling constraints (e.g. tRRD, tCCD, tFAW, tWTR, etc.). Thus, the issuance of commands may be delayed based on such command scheduling constraints.

Figure 8:
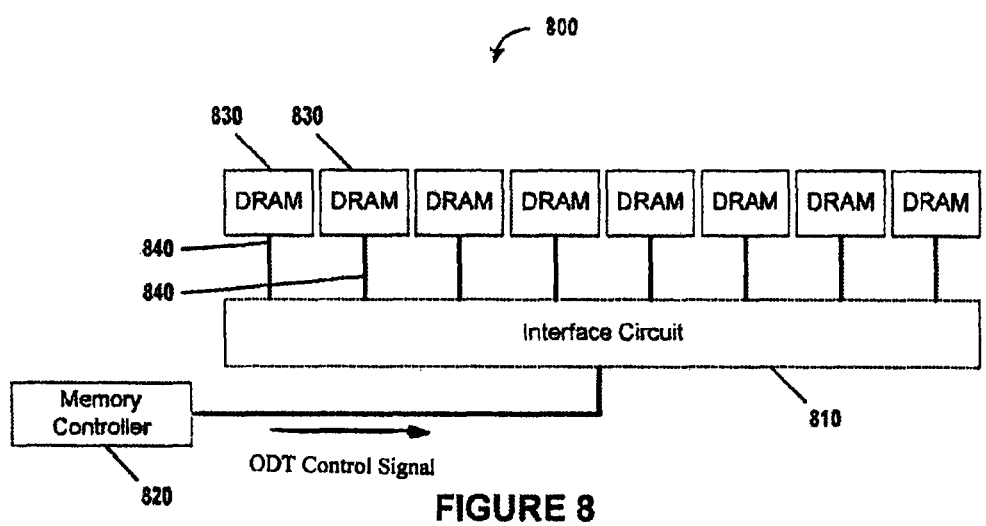
FIG. 8 illustrates a block diagram showing an interface circuit disposed between an array of DRAM devices and a memory controller, in accordance with yet another embodiment.

FIG. 8 illustrates a block diagram 800 showing an interface circuit disposed between an array of DRAM devices and a memory controller, in accordance with yet another embodiment. As an option, the block diagram 800 may be associated with the architecture and environment of FIGS. 1-6. Of course, the block diagram 800 may be associated with any desired environment. Further, the aforementioned definitions may equally apply to the description below.

As shown, an interface circuit 810 provides a DRAM interface to the memory controller 820, and directs commands to independent DRAM devices 830. The memory devices 830 may each be associated with a different data bus 540, thus preventing inter-device constraints. In addition, individual and independent memory devices 830 may be used to emulate part of a virtual memory device (e.g. column, row, bank, etc.). Accordingly, intra-device constraints may also be prevented. To this end, the memory devices 830 connected to the interface circuit 510 may appear to the memory controller 820 as a group of one or more memory devices 530 that are free from command-scheduling constraints.

In one exemplary embodiment, N physical DRAM devices may be used to emulate M logical DRAM devices through the use of the interface circuit. The interface circuit may accept a command stream from a memory controller directed toward the M logical devices. The interface circuit may also translate the commands to the N physical devices that are connected to the interface circuit via P independent data paths. The command translation may include, for example, routing the correct command directed to one of the M logical devices to the correct device (e.g. one of the N physical devices). Collectively, the P data paths connected to the N physical devices may optionally allow the interface circuit to guarantee that commands may be executed in parallel and independently, thus preventing command-scheduling constraints associated with the N physical devices. In this way the interface circuit may eliminate idle data-bus cycles or bubbles that would otherwise be present due to inter-device and intra-device command-scheduling constraints.

Figure 9:
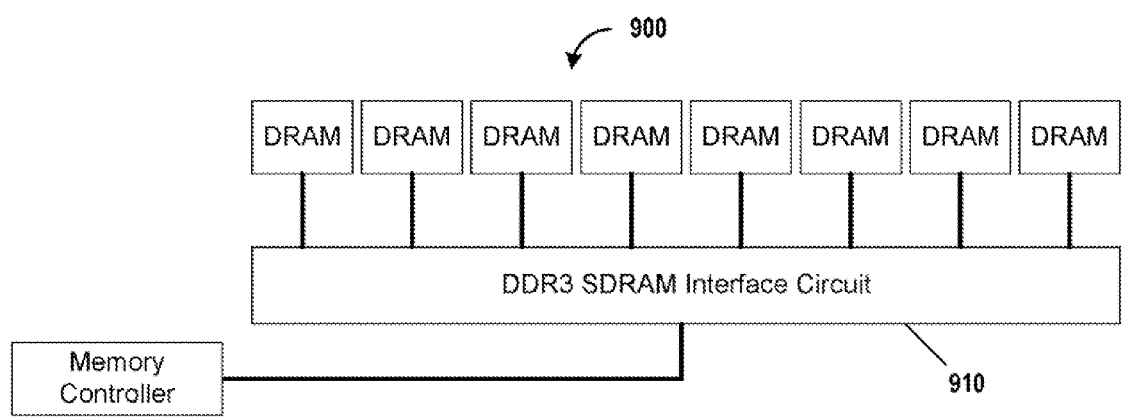
FIG. 9 illustrates a block diagram showing a DDR3 SDRAM interface circuit disposed between an array of DRAM devices and a memory controller, in accordance with another embodiment.

FIG. 9 illustrates a block diagram 900 showing a DDR3 SDRAM interface circuit disposed between an array of DRAM devices and a memory controller, in accordance with another embodiment. As an option, the block diagram 900 may be associated with the architecture and environment of FIGS. 1-8. Of course, the block diagram 900 may be associated with any desired environment. Further, the aforementioned definitions may equally apply to the description below.

As shown, a DDR3 SDRAM interface circuit 910 eliminates idle data-bus cycles due to inter-device and intra-device scheduling constraints. In the context of the present embodiment, the DDR3 SDRAM interface circuit 910 may include a command translation circuit of an interface circuit that connects multiple DDR3 SDRAM device with multiple independent data buses. For example, the DDR3 SDRAM interface circuit 910 may include command-and-control and address components capable of intercepting signals between the physical memory circuits and the system. Moreover, the command-and-control and address components may allow for burst merging, as described below with respect to FIG. 10.

Figure 10:
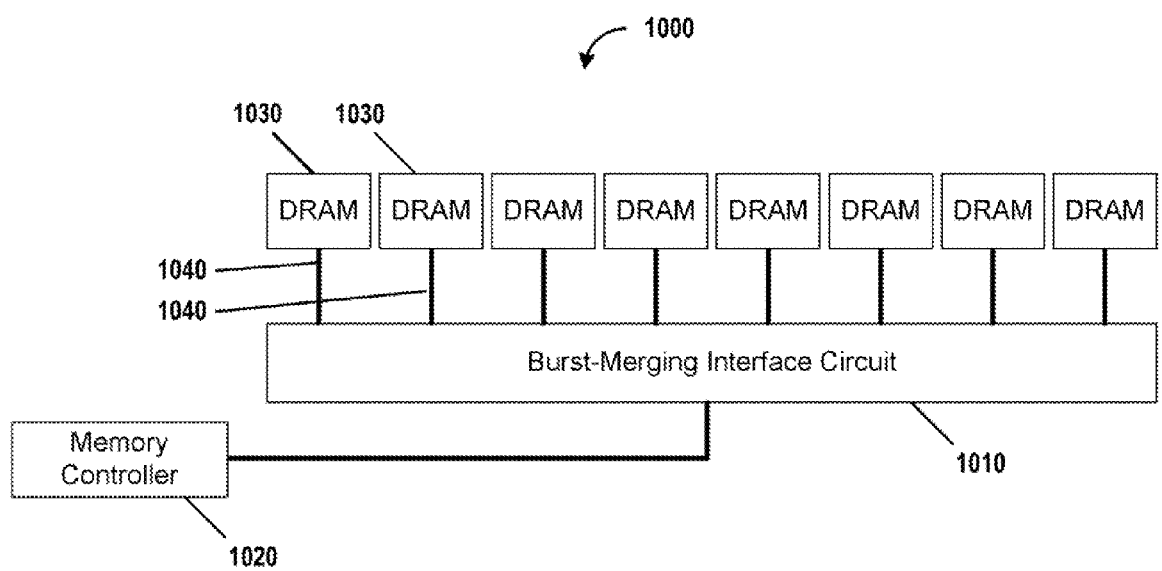
FIG. 10 illustrates a block diagram showing a burst-merging interface circuit connected to multiple DRAM devices with multiple independent data buses, in accordance with still yet another embodiment.

FIG. 10 illustrates a block diagram 1000 showing a burst-merging interface circuit connected to multiple DRAM devices with multiple independent data buses, in accordance with still yet another embodiment. As an option, the block diagram 1000 may be associated with the architecture and environment of FIGS. 1-9. Of course, the block diagram 1000 may be associated with any desired environment. Further, the aforementioned definitions may equally apply to the description below.

A burst-merging interface circuit 1010 may include a data component of an interface circuit that connects multiple DRAM devices 1030 with multiple independent data buses 1040. In addition, the burst-merging interface circuit 1010 may merge multiple burst commands received within a time period. As shown, eight DRAM devices 1030 may be connected via eight independent data paths to the burst-merging interface circuit 1010. Further, the burst-merging interface circuit 1010 may utilize a single data path to the memory controller 820. It should be noted that while eight DRAM devices 1030 are shown herein, in other embodiments, 16, 24, 32, etc. devices may be connected to the eight independent data paths. In yet another embodiment, there may be two, four, eight, 16 or more independent data paths associated with the DRAM devices 1030.

The burst-merging interface circuit 1010 may provide a single electrical interface to the memory controller 1020, therefore eliminating inter-device constraints (e.g. rank-to-rank turnaround time, etc.). In one embodiment, the memory controller 1020 may be aware that it is indirectly controlling the DRAM devices 1030 through the burst-merging interface circuit 1010, and that no bus turnaround time is needed. In another embodiment, the burst-merging interface circuit 1010 may use the DRAM devices 1030 to emulate M logical devices. The burst-merging interface circuit 1010 may further translate row-activation commands and column-access commands to one of the DRAM devices 1030 in order to ensure that inter-device constraints (e.g. tRRD, tCCD, tFAW and tWTR etc.) are met by each individual DRAM device 1030, while allowing the burst-merging interface circuit 1010 to present itself as M logical devices that are free from inter-device constraints.

Figure 11:
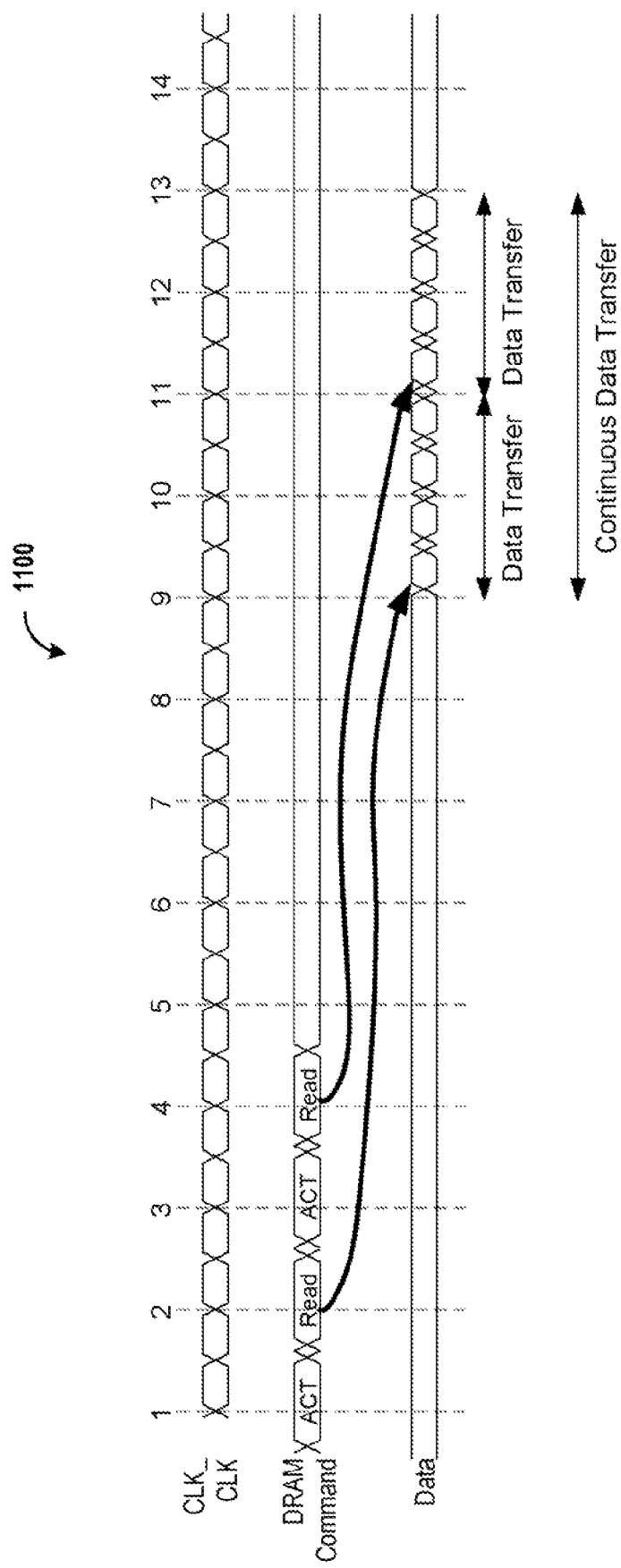
FIG. 11 illustrates a timing diagram showing continuous data transfer over multiple commands in a command sequence, in accordance with another embodiment.

FIG. 11 illustrates a timing diagram 1100 showing continuous data transfer over multiple commands in a command sequence, in accordance with another embodiment. As an option, the timing diagram 1100 may be associated with the architecture and environment of FIGS. 1-10. Of course, the timing diagram 1100 may be associated with any desired environment. Further, the aforementioned definitions may equally apply to the description below.

As shown, inter-device and intra-device constraints are eliminated, such that the burst-merging interface circuit may permit continuous burst data transfers on the data bus, therefore increasing data bandwidth. For example, an interface circuit associated with the burst-merging interface circuit may present an industry-standard DRAM interface to a memory controller as one or more DRAM devices that are free of command-scheduling constraints. Further, the interface circuits may allow the DRAM devices to be emulated as being free from command-scheduling constraints without necessarily changing the electrical interface or the command set of the DRAM memory system. It should be noted that the interface circuits described herein may include any type of memory system (e.g. DDR2, DDR3, etc.).

Figure 12:
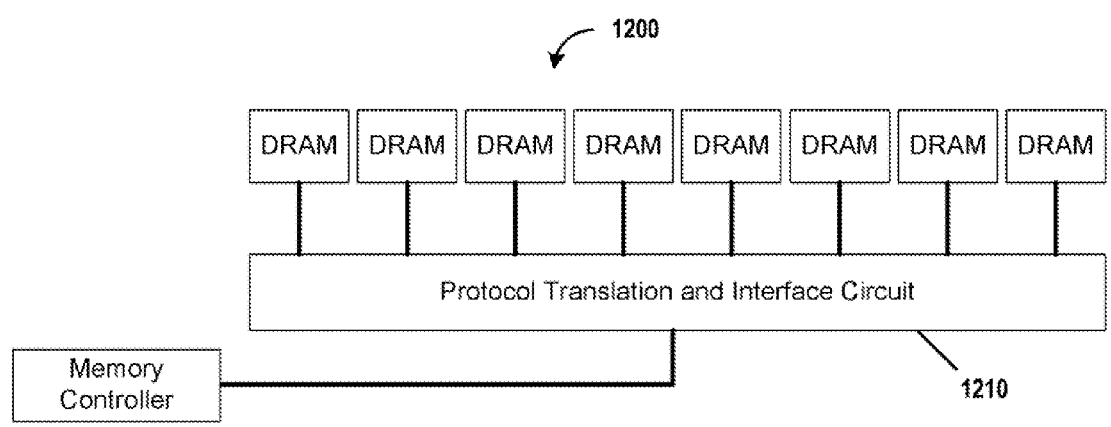
FIG. 12 illustrates a block diagram showing a protocol translation and interface circuit connected to multiple DRAM devices with multiple independent data buses, in accordance with yet another embodiment.

FIG. 12 illustrates a block diagram 1200 showing a protocol translation and interface circuit connected to multiple DRAM devices with multiple independent data buses, in accordance with yet another embodiment. As an option, the block diagram 1200 may be associated with the architecture and environment of FIGS. 1-11. Of course, the block diagram 1200 may be associated with any desired environment. Further, the aforementioned definitions may equally apply to the description below.

As shown, a protocol translation and interface circuit 1210 may perform protocol translation and/or manipulation functions, and may also act as an interface circuit. For example, the protocol translation and interface circuit 1210 may be included within an interface circuit connecting a memory controller with multiple memory devices.

In one embodiment, the protocol translation and interface circuit 1210 may delay row-activation commands and/or column-access commands. The protocol translation and interface circuit 1210 may also transparently perform different kinds of address mapping schemes that depend on the expected arrival time of the column-access command. In one scheme, the column-access command may be sent by the memory controller at the normal time (i.e. late arrival, as compared to a scheme where the column-access command is early).

In a second scheme, the column-access command may be sent by the memory controller before the row-access command is required (i.e. early arrival) at the DRAM device interface. In DDR2 an DDR3 SDRAM memory systems, the early arriving column-access command may be referred to as the Posted-CAS command. Thus, part of a row may be activated as needed, therefore providing sub-row activation. In addition, lower power may also be provided.

It should be noted that the embodiments of the above-described schemes may not necessarily require additional pins or new commands to be sent by the memory controller to the protocol translation and interface circuit. In this way, a high bandwidth DRAM device may be provided.

As shown, the protocol translation and interface circuit 1210 may include eight DRAM devices to be connected thereto via eight independent data paths to. For example, the protocol translation and interface circuit 1210 may emulate a single 8 Gb DRAM device with eight 1 Gb DRAM devices. The memory controller may therefore expect to see eight banks, 32768 rows per bank, 4096 columns per row, and four bits per column. When the memory controller issues a row-activation command, it may expect that 4096 columns are ready for a column-access command that follows, whereas the 1 Gb devices may only have 2048 columns per row. Similarly, the same issue of differing row sizes may arise when 2 Gb devices are used to emulate a 16 Gb DRAM device or 4 Gb devices are used to emulate a 32 Gb device, etc.

To accommodate for the difference between the row sizes of the 1 Gb and 8 Gb DRAM devices, 2 Gb and 16 Gb DRAM devices, 4 Gb and 32 Gb DRAM devices, etc., the protocol translation and interface circuit 1210 may calculate and issue the appropriate number of row-activation commands to prepare for a subsequent column-access command that may access any portion of the larger row. The protocol translation and interface circuit 1210 may be configured with different behaviors, depending on the specific condition.

In one exemplary embodiment, the memory controller may not issue early column-access commands. The protocol translation and interface circuit 1210 may activate multiple, smaller rows to match the size of the larger row in the higher capacity logical DRAM device.

Furthermore, the protocol translation and interface circuit 1210 may present a single data path to the memory controller, as shown. Thus, the protocol translation and interface circuit 1210 may present itself as a single DRAM device with a single electrical interface to the memory controller. For example, if eight 1 Gb DRAM devices are used by the protocol translation and interface circuit 1210 to emulate a single, standard 8 Gb DRAM device, the memory controller may expect that the logical 8 Gb DRAM device will take over 300 ns to perform a refresh command. The protocol translation and interface circuit 1210 may also intelligently schedule the refresh commands. Thus, for example, the protocol translation and interface circuit 1210 may separately schedule refresh commands to the 1 Gb DRAM devices, with each refresh command taking 100 ns.

To this end, where multiple physical DRAM devices are used by the protocol translation and interface circuit 1210 to emulate a single larger DRAM device, the memory controller may expect that the logical device may take a relatively long period to perform a refresh command. The protocol translation and interface circuit 1210 may separately schedule refresh commands to each of the physical DRAM devices. Thus, the refresh of the larger logical DRAM device may take a relatively smaller period of time as compared with a refresh of a physical DRAM device of the same size. DDR3 memory systems may potentially require calibration sequences to ensure that the high speed data I/O circuits are periodically calibrated against thermal-variances induced timing drifts. The staggered refresh commands may also optionally guarantee I/O quiet time required to separately calibrate each of the independent physical DRAM devices.

Thus, in one embodiment, a protocol translation and interface circuit 1210 may allow for the staggering of refresh times of logical DRAM devices. DDR3 devices may optionally require different levels of zero quotient (ZQ) calibration sequences, and the calibration sequences may require guaranteed system quiet time, but may be power intensive, and may require that other I/O in the system are not also switching at the same time. Thus, refresh commands in a higher capacity logical DRAM device may be emulated by staggering refresh commands to different lower capacity physical DRAM devices. The staggering of the refresh commands may optionally provide a guaranteed I/O quiet time that may be required to separately calibrate each of the independent physical DRAM devices.

Figure 13:
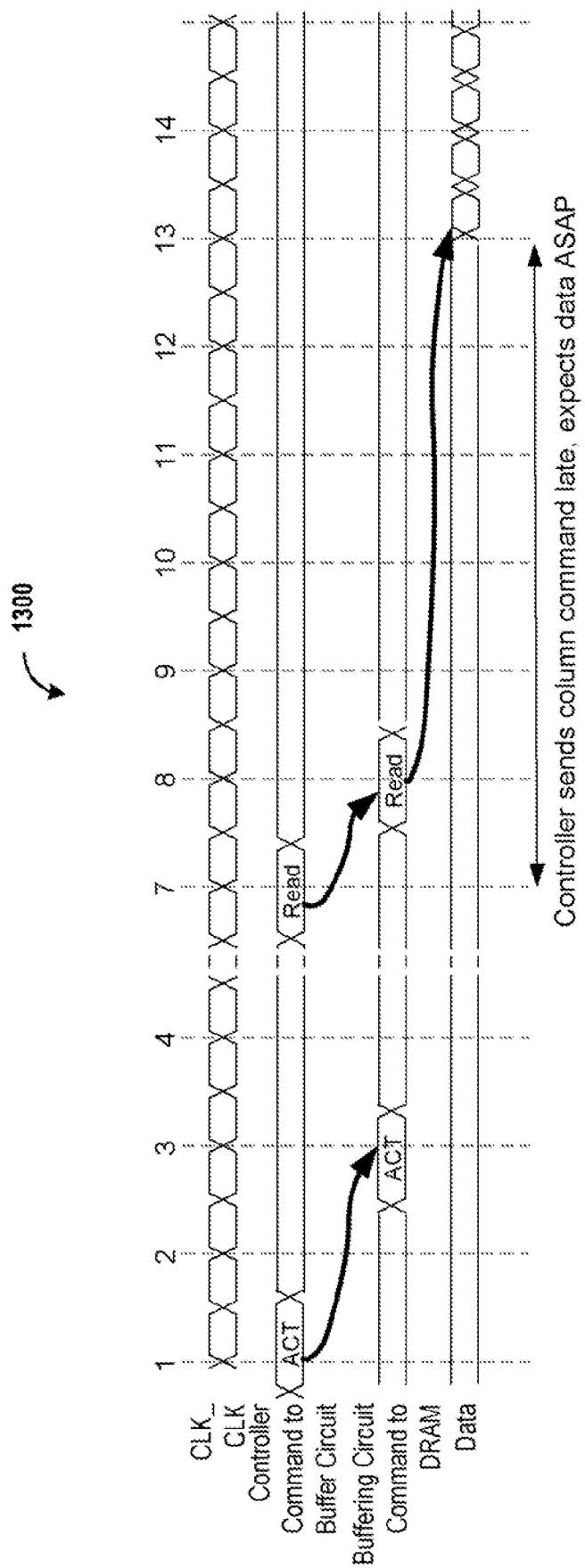
FIG. 13 illustrates a timing diagram showing the effect when a memory controller issues a column-access command late, in accordance with another embodiment.

FIG. 13 illustrates a timing diagram 1300 showing the effect when a memory controller issues a column-access command late, in accordance with another embodiment. As an option, the timing diagram 1300 may be associated with the architecture and environment of FIGS. 1-12. Of course, the timing diagram 1300 may be associated with any desired environment. Further, the aforementioned definitions may equally apply to the description below.

As shown, in a memory system where the memory controller issues the column-access command without enough latency to cover both the DRAM device row-access latency and column-access latency, the interface circuit may send multiple row-access commands to multiple DRAM devices to guarantee that the subsequent column access will hit an open bank. In one exemplary embodiment, the physical device may have a 1 kilobyte (kb) row size and the logical device may have a 2 kb row size. In this case, the interface circuit may activate two 1 kb rows in two different physical devices (since two rows may not be activated in the same device within a span of tRRD). In another exemplary embodiment, the physical device may have a 1 kb row size and the logical device may have a 4 kb row size. In this case, four 1 kb rows may be opened to prepare for the arrival of a column-access command that may be targeted to any part of the 4 kb row.

In one embodiment, the memory controller may issue column-access commands early. The interface circuit may do this in any desired manner, including for example, using the additive latency property of DDR2 and DDR3 devices. The interface circuit may also activate one specific row in one specific DRAM device. This may allow sub-row activation for the higher capacity logical DRAM device.

Figure 14:
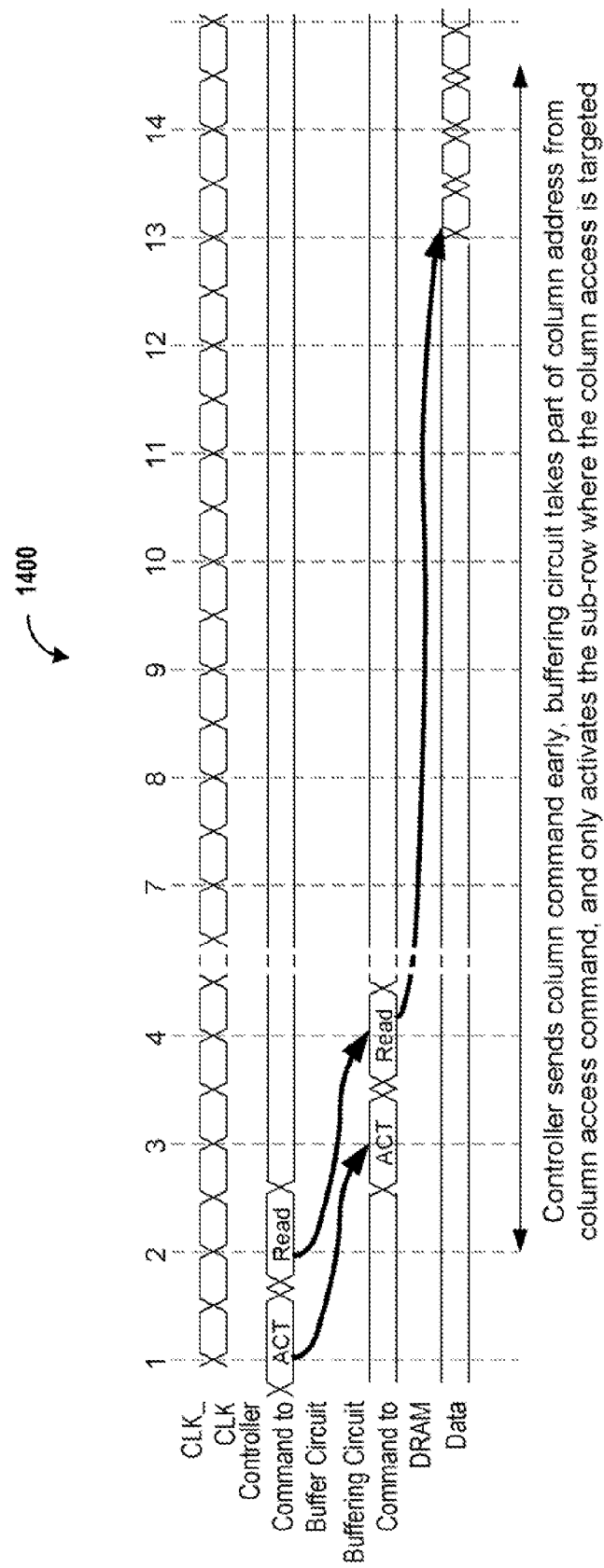
FIG. 14 illustrates a timing diagram showing the effect when a memory controller issues a column-access command early, in accordance with still yet another embodiment.

FIG. 14 illustrates a timing diagram 1400 showing the effect when a memory controller issues a column-access command early, in accordance with still yet another embodiment. As an option, the timing diagram 1400 may be associated with the architecture and environment of FIGS. 1-13. Of course, the timing diagram 1400 may be associated with any desired environment. Further, the aforementioned definitions may equally appear to the description below.

In the context of the present embodiment, a memory controller may issue a column-access command early, i.e. before the row-activation command is to be issued to a DRAM device. Accordingly, an interface circuit may take a portion of the column address, combine it with the row address and form a sub-row address. To this end, the interface circuit may activate the row that is targeted by the column-access command. Just by way of example, if the physical device has a 1 kg row size and the logical device has a 2 kb row size, the early column-access command may allow the interface circuit to activate a single 1 kb row. The interface circuit can thus implement sub-row activation for a logical device with a larger row size than the physical devices without necessarily the use of additional pins or special commands.

Figure 15:
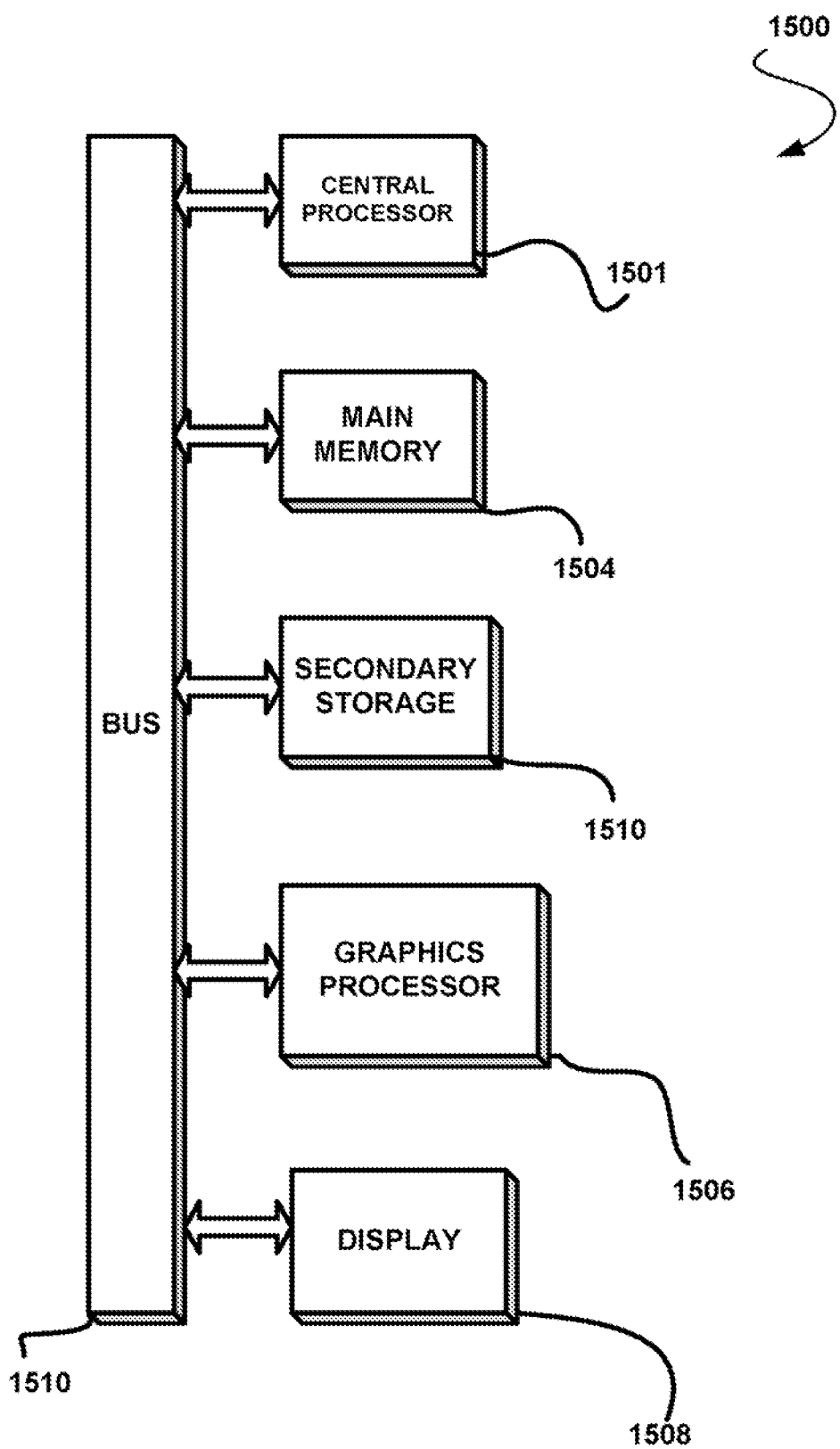
FIG. 15 illustrates a representative hardware environment, in accordance with one embodiment.

FIG. 15 illustrates a representative hardware environment 1500, in accordance with one embodiment. As an option, the hardware environment 1500 may be implemented in the context of FIGS. 1-14. For example, the hardware environment 1500 may constitute an exemplary system.

In one exemplary embodiment, the hardware environment 1500 may include a computer system. As shown, the hardware environment 1500 includes at least one central processor 1501 which is connected to a communication bus 1502. The hardware environment 1500 also includes main memory 1504. The main memory 1504 may include, for example random access memory (RAM) and/or any other desired type of memory. Further, in various embodiments, the main memory 1504 may include memory circuits, interface circuits, etc.

The hardware environment 1500 also includes a graphics processor 1506 and a display 1508. The hardware environment 1500 may also include a secondary storage 1510. The secondary storage 1510 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 1504 and/or the secondary storage 1510. Such computer programs, when executed, enable the computer system 1500 to perform various functions. Memory 1504, storage 1510 and/or any other storage are possible examples of computer-readable media.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A sub-system, comprising:
a first number of physical memory circuits comprising a first physical memory circuit, a second physical memory circuit, and a third physical memory circuit;
an interface circuit electrically connected to the first physical memory circuit, the second physical memory circuit, and the third physical memory circuit via a first data bus, a second data bus, and a third data bus, respectively,
wherein the interface circuit is configured to communicate with the first number of physical memory circuits and a system,
wherein the interface circuit is configured to interface the first number of physical memory circuits that are associated with first command scheduling constraints, in order to simulate a different second number of virtual memory circuits that are associated with second command scheduling constraints, such that the first number of physical memory circuits appear to the system as the second number of virtual memory circuits that are associated with the second command scheduling constraints,
wherein the second number of virtual memory circuits include a first virtual memory circuit and a second virtual memory circuit,
wherein the first virtual memory circuit is simulated by the interface circuit using at least the first physical memory circuit, and the second virtual memory circuit is simulated by the interface circuit using at least the second physical memory circuit and the third physical memory circuit,
wherein the interface circuit is configured to receive one or more system control signals directed to at least one of the second number of virtual memory circuits and to provide one or more physical control signals to at least one of the first number of physical memory circuits, and
wherein the interface circuit is configured to:
(i) access data from the first physical memory circuit via the first data bus and access data from the second physical memory circuit via the second bus, so as to access data from the first virtual memory circuit followed by the second virtual memory circuit without an inter-device command scheduling constraint, and
(ii) access data from the second physical memory circuit via the second data bus and access data from the third physical memory circuit via the third bus, so as to access data from a first row of the second virtual memory circuit followed by a second row of the second virtual memory circuit without an intra-device command scheduling constraint.

2. The sub-system as set forth in claim 1, wherein the first command scheduling constraints and the second command scheduling constraints include inter-device command scheduling constraints.

3. The sub-system as set forth in claim 2, wherein the inter-device command scheduling constraints include at least one of a rank-to-rank data bus turnaround time or an on-die termination (ODT) control switching time.

4. The sub-system as set forth in claim 1, wherein the first command scheduling constraints and the second command scheduling constraints include intra-device command scheduling constraints.

5. The sub-system as set forth in claim 4, wherein the intra-device command scheduling constraints include at least one of a column-to-column delay time (tCCD), a row-to-row activation delay time (tRRD), a four-bank activation window time (tFAW), or a write-to-read turn-around time (tWTR).

6. The sub-system as set forth in claim 1, wherein the interface circuit is further configured to issue, in place of the one or more system control signals directed to the at least one of the second number of virtual memory circuits, the one or more physical control signals directed to the at least one of the first number of physical memory circuits.

7. The sub-system as set forth in claim 1, wherein the interface circuit is further configured to issue row-access commands and column-access commands.

8. The sub-system as set forth in claim 1, wherein the one or more physical control signals are issued to different physical memory circuits utilizing separate busses.

9. The sub-system as set forth in claim 1, wherein the interface circuit includes a circuit that is positioned on a dual in-line memory module (DIMM).

10. The sub-system as set forth in claim 1, wherein the interface circuit is a buffer, a register, a memory controller, or an advanced memory buffer (AMB).

11. The sub-system as set forth in claim 1, wherein the interface circuit and the first number of physical memory circuits take the form of a stack.

12. The sub-system as set forth in claim 1, wherein the first number of physical memory circuits include a plurality of dynamic random access memory (DRAM) circuits.

13. The sub-system in claim 1, wherein the one or more system control signals satisfy the second command scheduling constraints including an on-die termination (ODT) control switching time associated with the at least one of the second number of virtual memory circuits.

14. The sub-system in claim 1, wherein the one or more physical control signals satisfy the first command scheduling constraints including an on-die termination (ODT) control switching time associated with the at least one the first number of physical memory circuits.

15. A method, comprising:
   interfacing a first number of physical memory circuits that are associated with first command scheduling constraints, in order to simulate a different second number of virtual memory circuits that are associated with second command scheduling constraints, such that the first number of physical memory circuits appear to a system as the second number of virtual memory circuits that are associated with the second command scheduling constraints, wherein the second command scheduling constraints include fewer limitations for scheduling commands than the first command scheduling constraints,
   receiving one or more system control signals directed to at least one of the second number of virtual memory circuits;
   providing one or more physical control signals to at least one of the first number of physical memory circuits,
   wherein the first number of physical memory circuits include a first physical memory circuit, a second physical memory circuit, and a third physical memory circuit,
   wherein the interfacing further comprises electrically connecting to the first physical memory circuit, the second physical memory circuit, and the third physical memory circuit via a first data bus, a second data bus, and a third data bus, respectively,
   wherein the second number of virtual memory circuits include a first virtual memory circuit and a second virtual memory circuit,
   wherein the first virtual memory circuit is simulated using at least the first physical memory circuit, and the second virtual memory circuit is simulated using at least the second physical memory circuit and the third physical memory circuit;
   accessing data from the first physical memory circuit via the first data bus and accessing data from the second physical memory circuit via the second bus, so as to access data from the first virtual memory circuit followed by the second virtual memory circuit without an inter-device command scheduling constraint; and
   accessing data from the second physical memory circuit via the second data bus and accessing data from the third physical memory circuit via the third bus, so as to access data from a first row of the second virtual memory circuit followed by a second row of the second virtual memory circuit without an intra-device command scheduling constraint.

16. A system, comprising:
   a host system;
   a first number of physical memory circuits comprising a first physical memory circuit, a second physical memory circuit, and a third physical memory circuit; and
   an interface circuit electrically connected to the first physical memory circuit, the second physical memory circuit, and the third physical memory circuit via a first data bus, a second data bus, and a third data bus, respectively,
   wherein the interface circuit is configured to communicate with the first number of physical memory circuits and the host system, the interface circuit configured to interface the first number of physical memory circuits in order to simulate a different second number of virtual memory circuits that are associated with second command scheduling constraints, such that the first number of physical memory circuits appear to the host system as the second number of virtual memory circuits that are associated with the second command scheduling constraints,
   wherein the second number of virtual memory circuits include a first virtual memory circuit and a second virtual memory circuit,
   wherein the first virtual memory circuit is simulated by the interface circuit using at least the first physical memory circuit, and the second virtual memory circuit is simulated by the interface circuit using at least the second physical memory circuit and the third physical memory circuit, and
   wherein the interface circuit is configured to receive one or more system control signals directed to at least one of the second number of virtual memory circuits and to provide one or more physical control signals to at least one of the first number of physical memory circuits,
   wherein the interface circuit is configured to:
      (i) access data from the first physical memory circuit via the first data bus and access data from the second physical memory circuit via the second bus, so as to access data from the first virtual memory circuit followed by the second virtual memory circuit without an inter-device command scheduling constraint, and
      (ii) access data from the second physical memory circuit via the second data bus and access data from the third physical memory circuit via the third bus, so as to access data from a first row of the second virtual memory circuit followed by a second row of the second virtual memory circuit without an intra-device command scheduling constraint.

17. The system as set forth in claim 16, wherein the first number of physical memory circuits and the interface circuit are positioned on a dual in-line memory module (DIMM).

18. The system as set forth in claim 16, wherein the first number of physical memory circuits and the interface circuit are positioned on a memory module that is configured to use a bus to communicate with a memory controller.

* * * * *